(12) United States Patent
Ikeda et al.

(10) Patent No.: US 8,742,405 B2
(45) Date of Patent: Jun. 3, 2014

(54) LIGHT EMITTING UNIT, LIGHT EMITTING DEVICE, AND LIGHTING DEVICE

(75) Inventors: Hisao Ikeda, Kanagawa (JP); Satoshi Seo, Kanagawa (JP); Shunpei Yamazaki, Tokyo (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 84 days.

(21) Appl. No.: 13/371,055

(22) Filed: Feb. 10, 2012

(65) Prior Publication Data

US 2012/0205634 A1 Aug. 16, 2012

(30) Foreign Application Priority Data

Feb. 11, 2011 (JP) .................. 2011-027975

(51) Int. Cl.
*H01L 27/32* (2006.01)
(52) U.S. Cl.
USPC ............... 257/40; 257/98; 257/642; 257/643
(58) Field of Classification Search
USPC .......... 257/40, 98, 642–643, 759, E39.007, 257/E51.001–E51.052, E27.117–E27.119
See application file for complete search history.

(56) References Cited

U.S. PATENT DOCUMENTS

| | | | |
|---|---|---|---|
| 2,972,692 A | 2/1961 | Thornton | |
| 3,833,833 A | 9/1974 | Nelson | |
| 4,298,869 A | 11/1981 | Okuno | |
| 5,935,721 A * | 8/1999 | Shi et al. ............ | 428/690 |
| 5,939,839 A | 8/1999 | Robel et al. | |
| 6,133,581 A | 10/2000 | Terao et al. | |
| 6,157,127 A | 12/2000 | Hosokawa et al. | |
| 6,335,713 B1 | 1/2002 | Imai | |
| 6,462,722 B1 | 10/2002 | Kimura et al. | |
| 6,522,315 B2 | 2/2003 | Ozawa et al. | |
| 6,693,296 B1 | 2/2004 | Tyan | |
| 6,717,358 B1 | 4/2004 | Liao et al. | |
| 6,747,639 B2 | 6/2004 | So | |
| 6,839,045 B2 | 1/2005 | Ozawa et al. | |
| 7,005,196 B1 | 2/2006 | Carter et al. | |
| 7,012,585 B2 | 3/2006 | Agostinelli et al. | |
| 7,068,418 B2 | 6/2006 | Kawase | |
| 7,148,632 B2 | 12/2006 | Berman et al. | |

(Continued)

FOREIGN PATENT DOCUMENTS

EP 0 597 226 A1 5/1994
EP 1 255 240 A1 11/2002

(Continued)

*Primary Examiner* — Julio J Maldonado
*Assistant Examiner* — Jaehwan Oh
(74) *Attorney, Agent, or Firm* — Husch Blackwell LLP

(57) ABSTRACT

The light-emitting unit has at least a first light-emitting element, a second light-emitting element, and a separation layer. The separation layer has a leg portion and a stage portion which protrudes outside of a bottom surface of the leg portion over the leg portion. An upper electrode of the first light-emitting element is electrically connected to a lower electrode of the second light-emitting element in a region where the upper electrode and the lower electrode overlap with the stage portion of the separation layer. By providing the separation layer, the light-emitting unit can be formed without using a metal mask. The upper electrode can be a composite material including an organic compound and a metal oxide or a stacked layer of the composite material and a metal material or a light-transmitting conductive material.

20 Claims, 11 Drawing Sheets

(56) References Cited

U.S. PATENT DOCUMENTS

| | | |
|---|---|---|
| 7,180,483 B2 | 2/2007 | Kimura et al. |
| 7,199,516 B2 | 4/2007 | Seo et al. |
| 7,221,339 B2 | 5/2007 | Ozawa et al. |
| 7,253,793 B2 | 8/2007 | Ozawa et al. |
| 7,255,939 B2 | 8/2007 | Carter et al. |
| 7,271,785 B2 | 9/2007 | Jang |
| 7,285,801 B2 | 10/2007 | Eliashevich et al. |
| 7,322,718 B2 | 1/2008 | Setomoto et al. |
| 7,468,580 B2 | 12/2008 | Kawase |
| 7,710,364 B2 | 5/2010 | Ozawa et al. |
| 7,737,629 B2 | 6/2010 | Okuyama et al. |
| 7,888,864 B2 | 2/2011 | Young |
| 7,999,463 B2 | 8/2011 | Nomura |
| 2002/0196206 A1 | 12/2002 | Kimura et al. |
| 2003/0048072 A1 | 3/2003 | Ishihara et al. |
| 2003/0098827 A1 | 5/2003 | Ozawa et al. |
| 2003/0117348 A1 | 6/2003 | Knapp et al. |
| 2003/0122805 A1 | 7/2003 | So |
| 2003/0141807 A1 | 7/2003 | Kawase |
| 2003/0151360 A1 | 8/2003 | Fukunaga et al. |
| 2003/0170491 A1 | 9/2003 | Liao et al. |
| 2003/0189401 A1 | 10/2003 | Kido et al. |
| 2003/0227253 A1 | 12/2003 | Seo et al. |
| 2003/0231273 A1 | 12/2003 | Kimura et al. |
| 2004/0021425 A1 | 2/2004 | Foust et al. |
| 2004/0031957 A1 | 2/2004 | Tyan |
| 2004/0032220 A1* | 2/2004 | Cok et al. ............... 315/291 |
| 2004/0150591 A1 | 8/2004 | Ozawa et al. |
| 2005/0077838 A1 | 4/2005 | Blumel |
| 2005/0174064 A1 | 8/2005 | Agostinelli et al. |
| 2005/0218791 A1 | 10/2005 | Kawase |
| 2005/0225973 A1 | 10/2005 | Eliashevich et al. |
| 2006/0119253 A1 | 6/2006 | Carter et al. |
| 2006/0220544 A1 | 10/2006 | Okuyama et al. |
| 2006/0273995 A1 | 12/2006 | Ozawa et al. |
| 2006/0273996 A1 | 12/2006 | Ozawa et al. |
| 2006/0279491 A1 | 12/2006 | Ozawa et al. |
| 2006/0284189 A1* | 12/2006 | Sakata et al. ............... 257/79 |
| 2007/0182317 A1 | 8/2007 | Kido et al. |
| 2008/0001512 A1 | 1/2008 | Nomura |
| 2008/0224606 A1* | 9/2008 | Kawai et al. ............... 313/504 |
| 2008/0246704 A1 | 10/2008 | Kawase |
| 2009/0047752 A1* | 2/2009 | Yamazaki et al. ............... 438/96 |
| 2010/0277403 A1 | 11/2010 | Chao et al. |
| 2011/0037054 A1 | 2/2011 | Shieh et al. |
| 2011/0089814 A1 | 4/2011 | Nomura |
| 2011/0089823 A1 | 4/2011 | Nomura |
| 2011/0101388 A1 | 5/2011 | Nomura |
| 2011/0140617 A1 | 6/2011 | Nomura |
| 2012/0062108 A1* | 3/2012 | Mima ............... 313/504 |
| 2012/0161167 A1 | 6/2012 | Yamazaki |
| 2012/0161174 A1 | 6/2012 | Yamazaki |
| 2012/0286250 A1* | 11/2012 | Yamamoto et al. ............... 257/40 |

FOREIGN PATENT DOCUMENTS

| | | |
|---|---|---|
| EP | 1 336 953 A2 | 8/2003 |
| EP | 1 337 131 A2 | 8/2003 |
| EP | 1 359 789 A1 | 11/2003 |
| EP | 1 363 265 A2 | 11/2003 |
| EP | 1 408 563 A2 | 4/2004 |
| EP | 1 619 654 A1 | 1/2006 |
| JP | 11-307261 | 11/1999 |
| JP | 2000-29404 | 1/2000 |
| JP | 2004-69774 | 3/2004 |
| JP | 2004-234868 | 8/2004 |
| JP | 2005-235491 | 9/2005 |
| JP | 2006-49853 | 2/2006 |
| JP | 2006-108651 | 4/2006 |
| JP | 2009-21575 | 1/2009 |
| JP | 2009-130132 | 6/2009 |
| WO | WO 00/36662 A1 | 6/2000 |

* cited by examiner

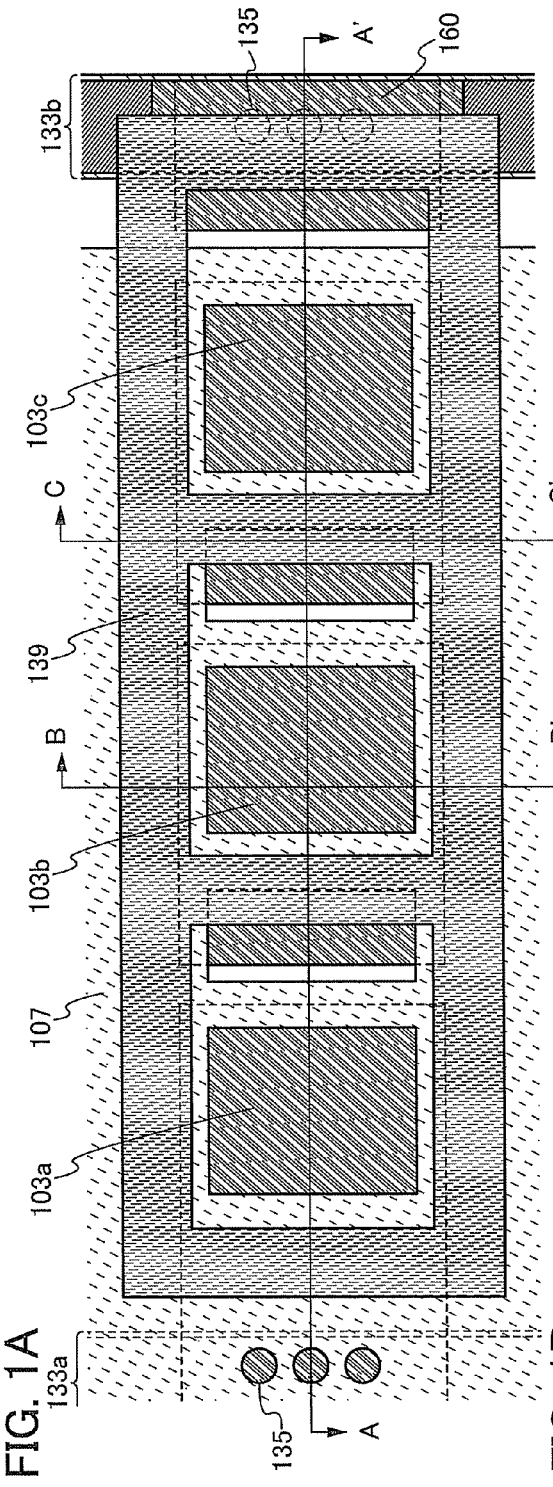
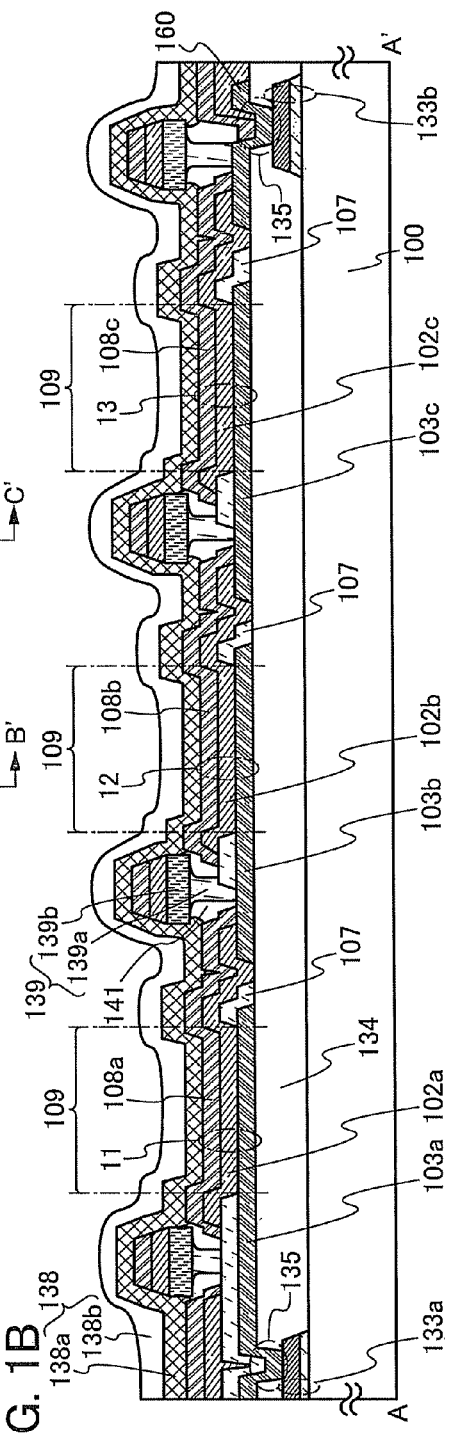

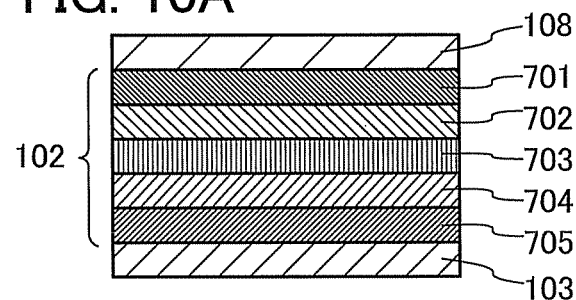
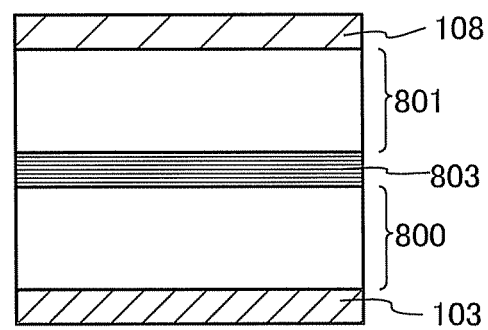
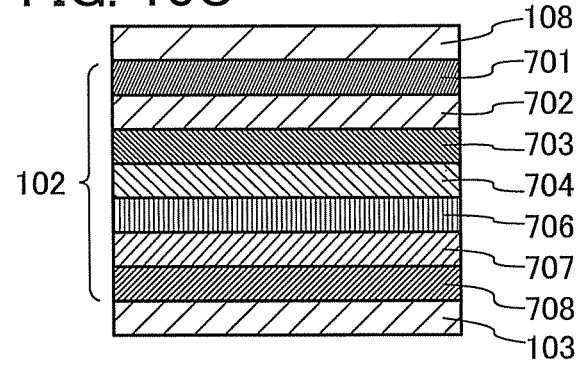

LIGHT EMITTING UNIT, LIGHT EMITTING DEVICE, AND LIGHTING DEVICE

BACKGROUND OF THE INVENTION

1. Field of the Invention

One embodiment of the present invention relates to a light-emitting unit including a light-emitting element utilizing organic electroluminescence (EL) (such a light-emitting element is also referred to as an organic EL element). One embodiment of the present invention relates to a light-emitting device and a lighting device each including the light-emitting unit.

2. Description of the Related Art

An organic EL element has been actively researched and developed. In the fundamental structure of the organic EL element, a layer containing a light-emitting organic compound is interposed between a pair of electrodes. By applying voltage to this element, light can be emitted from the light-emitting organic compound.

The organic EL element can be formed into a film; thus, a large-area element can be easily faulted. Therefore, the organic EL element has a high utility value as a surface light source that can be applied to lighting or the like.

For example, a lighting device including an organic EL element is disclosed in Patent Document 1.

REFERENCE

[Patent Document 1] Japanese Published Patent Application No. 2009-130132

SUMMARY OF THE INVENTION

An organic EL element can be driven at relatively low voltage, specifically, approximately 3 V to several tens of volts. Therefore, the organic EL element is suitable as a light-emitting element for use in which a power source with low output voltage (e.g., a battery) is used as a power source, specifically, a light-emitting element for portable use.

However, the voltage supplied from a home power line or the like is approximately 100 V to 240 V. Thus, the difference between the voltage and the driving voltage of the organic EL element is too big. In view of the above, a converter or the like which converts power, supply potential is needed when such a high voltage power source is used. In that case, a problem of energy loss by the converter arises. For example, the conversion efficiency of a converter which converts voltage tends to be reduced with an increase in the difference between input voltage and output voltage. Specifically, when power supply potential from a power line, which is approximately 100 V to 240 V, is reduced to the driving voltage of the organic EL element, which is approximately 3 V to several tens of volts, a problem that a large amount of energy is lost by the converter arises.

Further, an organic EL element includes a layer containing a light-emitting organic compound between a lower electrode and an upper electrode. As a method for stacking the layer containing an organic compound and the upper electrode in that order over the lower electrode formed over an insulating substrate, a vacuum evaporation method is given, for example. As a method for forming a plurality of EL layers and a plurality of upper electrodes using a vacuum evaporation method, a method using a metal mask (also referred to as a shadow mask), which is a metal plate provided with an opening, is known. The metal mask is provided between a substrate and an evaporation source, and evaporation is performed on the substrate through the opening in the metal mask, whereby evaporation can be performed with a shape depending on the shape of the opening. Note that when the distance between a metal mask and a substrate is short, an island-shaped layer can be formed with a clear shape depending on an opening, in other words, an island-shape whose periphery is less obscure.

However, the probability of the occurrence of defects becomes high when a metal mask is brought close to a substrate. For example, the substrate or another layer, which is already formed over the substrate, may be damaged by an edge of an opening in the metal mask. Specifically, when the metal mask is brought close to the substrate, the metal mask may scratch the surface of the substrate, so that another layer, which is already formed on the substrate, may be broken in some cases. Further, dust (including a small foreign substance referred to as a particle) attached to the metal mask may be attached again to the substrate.

In addition, when the resistivity of a lower electrode or an upper electrode included in an organic EL element is high, an increase in power consumption or luminance variation in a light-emitting surface caused by a voltage drop occur easily.

The present invention is made in view of the foregoing technical background. Therefore, an object of one embodiment of the present invention is to provide a light-emitting unit with a small energy loss. Another object of one embodiment of the present invention is to provide a light-emitting unit with high reliability. Further, another object of one embodiment of the present invention is to provide a light-emitting unit with a high aperture ratio. Furthermore, another object of one embodiment of the present invention is to provide a light-emitting unit which has little luminance variation in a light-emitting surface.

An object of one embodiment of the present invention is to provide a light-emitting device including a light-emitting unit with a small energy loss. Another object of one embodiment of the present invention is to provide a light-emitting device including a light-emitting unit with high reliability. Further, another object of one embodiment of the present invention is to provide a light-emitting device including a light-emitting unit with a high aperture ratio. Furthermore, another object of one embodiment of the present invention is to provide a light-emitting device including a light-emitting unit which has little luminance variation in a light-emitting surface.

An object of one embodiment of the present invention is to provide a lighting device including a light-emitting unit with a small energy loss. Another object of one embodiment of the present invention is to provide a lighting device including a light-emitting unit with high reliability. Further, another object of one embodiment of the present invention is to provide a lighting device including a light-emitting unit with a high aperture ratio. Furthermore, another object of one embodiment of the present invention is to provide a lighting device including a light-emitting unit which has little luminance variation in a light-emitting surface.

An object of one embodiment of the present invention is to provide a method for manufacturing a light-emitting unit with a small energy loss. Another object of one embodiment of the present invention is to provide a method for manufacturing a light-emitting unit with high reliability. Further, another object of one embodiment of the present invention is to provide a method for manufacturing a light-emitting unit which has little luminance variation in a light-emitting surface.

In order to drive an organic EL element having excellent emission efficiency with energy loss reduced as much as possible in the usage environment where high power supply potential is supplied, the organic EL element may be driven at high power supply voltage without using a converter which causes the energy loss, or power supply potential may be converted into power supply voltage at which the conversion efficiency of the converter is not impaired and the driving voltage of the organic EL element may be adjusted to the power supply potential. Specifically, a light-emitting unit in which organic EL elements are connected in series to increase the driving voltage may be formed and may be connected to high power supply potential through a converter.

However, in the light-emitting unit in which the plurality of organic EL elements is connected in series, the whole light-emitting unit is turned off when one of the connection portions of the organic EL elements is disconnected. In other words, the defect percentage of a lighting device including the light-emitting unit is the product of the connection portions of the light-emitting elements, which makes it difficult for the lighting device to have reliability.

In view of the above, the inventors focused on a structure of a connection portion where an upper electrode of one of light-emitting elements included in a light-emitting unit in which a plurality of organic EL elements (hereinafter simply referred to as light-emitting elements) is connected in series is connected to a lower electrode of the other of light-emitting elements and a metal mask causing defects. Then, a structure is considered, in which an upper electrode of a first light-emitting element is connected to a lower electrode of a second light-emitting element without using a metal mask. Specifically, a first partition wall covering an edge portion of the lower electrode of the first light-emitting element is provided; a separation layer including a leg portion and a stage portion, which protrudes over the electrode so that a projected area of the stage portion is larger than that of the leg portion, and a second partition wall, which is in contact with one side of the separation layer, are provided over the lower electrode of the second light-emitting element; and a layer containing a light-emitting organic compound and the upper electrode of the first light-emitting element and an upper electrode of the second light-emitting element, which overlap with the layer, are formed without using a metal mask, the upper electrode of the first light-emitting element is provided so as to extend beyond the edge portion of the lower electrode of the first light-emitting element with the first partition wall interposed therebetween, and is electrically connected to the lower electrode of the second light-emitting element in a region overlapping with the stage portion of the separation layer. With such a structure, the above problems have been solved.

Consequently, the light-emitting unit in which the first light-emitting element and the second light-emitting element are connected in series and the driving voltage is increased can be provided. In addition, a metal mask is not used for forming a plurality of upper electrodes, whereby the above-described problem that the periphery is obscure does not occur. Therefore, the upper electrode of the first light-emitting element can be connected to the lower electrode of the second light-emitting element accurately, whereby an aperture ratio of the light-emitting unit (the ratio of the area of the region in which light is actually emitted to the area of a light-emitting unit) can be increased.

In addition, by providing the first partition wall, a short circuit between the first electrode and the second electrode can be prevented at a step portion formed at the edge portion of the first electrode. Moreover, by providing the second partition wall, a short circuit between the third electrode and the fourth electrode can be prevented at a region where the third electrode and the fourth electrode overlap with the stage portion of the separation layer.

In addition, with a structure in which a plurality of EL layers and a plurality of upper electrodes can be manufactured without using a metal mask, defects caused by damage of a surface of the substrate due to an edge of an opening in the metal mask can be prevented; thus, the light-emitting unit with high reliability can be provided. Moreover, there are effects of reducing a manufacturing cost and a maintenance cost such as cleaning cost for the unnecessary metal mask.

A composite material including an organic compound and a metal oxide in a part of an EL layer which contacts with a lower electrode or an upper electrode included in an organic EL element is used, so that a loss of energy in the organic EL element can be reduced and the organic EL element with high light-emitting efficiency can be achieved. In addition, a halogen element is added to the composite material, whereby the resistivity of a composite material can be reduced and luminance variation in a light-emitting surface caused by a voltage drop can be reduced.

A composite material including an organic compound and a metal oxide can be used for a wiring or an electrode. Further, the composite material including a halogen element can be used for a wiring or an electrode. Furthermore, a stacked layer of the composite material and a metal material and/or a light-transmitting conductive material can be used for a wiring or an electrode.

By decreasing the resistivity of the upper electrode, a contact area between the upper electrode of the first light-emitting element and the lower electrode of the second light-emitting element can be smaller; therefore, an aperture ratio of a light-emitting unit can be increased.

As an organic compound included in the above composite material, an organic compound having a high hole-transport property can be used. Further, as the metal oxide, vanadium oxide, niobium oxide, tantalum oxide, chromium oxide, molybdenum oxide, tungsten oxide, manganese oxide, or rhenium oxide can be used. In particular, use of molybdenum oxide is preferable because of its stability in the air, a low hygroscopic property, and ease of handling. Moreover, use of molybdenum trioxide is further preferable. As the composite material, for example, a composite material including NPB and molybdenum trioxide can be used.

Note that in this specification, a lower electrode and an upper electrode of a first light-emitting element are also referred to as a first electrode and a second electrode, respectively. A lower electrode and an upper electrode of a second light-emitting element are also referred to as a third electrode and a fourth electrode, respectively.

One embodiment of the present invention is a light-emitting unit including a first light-emitting element which includes a first electrode, a second electrode overlapping with the first electrode, a first partition wall covering an edge portion of the first electrode, and a layer containing a light-emitting organic compound formed between the first electrode and the second electrode, and a second light-emitting element which includes a third electrode, a second partition wall formed over the third electrode, a separation wall formed over the third electrode and the second partition wall, a fourth electrode overlapping with the third electrode, a layer containing a light-emitting organic compound formed between the third electrode and the fourth electrode, wherein the second electrode is electrically connected to third electrode, and wherein the second electrode and the fourth electrode includes a compound including an organic compound and a metal oxide.

Note that a light-emitting element described in this specification has a top emission structure. Accordingly, a second electrode has a property of transmitting light emitted from a light-emitting organic compound. Note that the present invention can be used for a light-emitting element having a bottom emission structure or a dual emission structure. In the case of a light-emitting element having a bottom emission structure, a first electrode has a property of transmitting light emitted from a light-emitting organic compound. In the case of a light-emitting element having a dual emission structure, a first electrode and a second electrode have a property of transmitting light emitted from a light-emitting organic compound.

A light-emitting unit with a small energy loss can be provided. Further, a light-emitting unit with high reliability can be provided. Further, a light-emitting unit with a high aperture ratio can be provided. Furthermore, a light-emitting unit which has little luminance variation in a light-emitting surface can be provided.

A light-emitting device including a light-emitting unit with a small energy loss can be provided. Further, a light-emitting device including a light-emitting unit with high reliability can be provided. Further, a light-emitting device including a light-emitting unit with a high aperture ratio can be provided. Furthermore, a light-emitting device including a light-emitting unit which has little luminance variation in a light-emitting surface can be provided.

A lighting device including a light-emitting unit with a small energy loss can be provided. Further, a lighting device including a light-emitting unit with high reliability can be provided. Further, a lighting device including a light-emitting unit with a high aperture ratio can be provided. Furthermore, a lighting device including light-emitting unit which has little luminance variation in a light-emitting surface can be provided.

A method for manufacturing a light-emitting unit with a small energy loss can be provided. Further, a method for manufacturing a light-emitting unit with high reliability can be provided. Further, a method for manufacturing a light-emitting unit with a high aperture ratio can be provided. Furthermore, a method for manufacturing a light-emitting unit which has little luminance variation in a light-emitting surface can be provided.

BRIEF DESCRIPTION OF THE DRAWINGS

In the accompanying drawings:

FIGS. 1A and 1B are a top view and a cross-sectional view illustrating a light-emitting unit;

FIGS. 10A to 10C are diagrams each illustrating a structure of an EL layer; and

DETAILED DESCRIPTION OF THE INVENTION

Figure 2A:
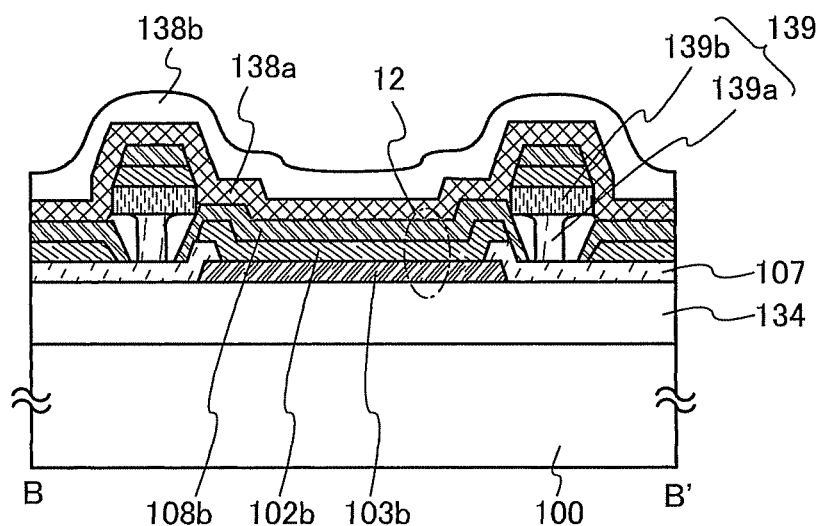
FIGS. 2A and 2B are cross-sectional views illustrating a light-emitting unit.

Hereinafter, embodiments of the present invention will be described with reference to the drawings. Note that the present invention is not limited to the following description and it will be readily appreciated by those skilled in the art that modes and details can be modified in various ways without departing from the spirit and the scope of the present invention. Therefore, the invention should not be construed as being limited to the description in the following embodiments.

The position, the size, the range, or the like of each structure illustrated in drawings and the like is not accurately represented in some cases for easy understanding. Therefore, the disclosed invention is not necessarily limited to the position, size, range, or the like as disclosed in the drawings and the like. In the drawings for explaining the embodiments, the same parts or parts having a similar function are denoted by the same reference numerals, and description of such parts is not repeated.

In this specification and the like, ordinal numbers such as "first", "second", and "third" are used in order to avoid confusion among components, and the terms do not mean limitation of the number of components.

(Embodiment 1)

In this embodiment, a light-emitting unit of one embodiment of the present invention will be described with reference to FIGS. 1A and 1B, FIGS. 2A and 2B, FIG. 3, FIGS. 4A to 4E, and FIGS. 5A to 5C.

STRUCTURAL EXAMPLE

First, a structure of the light-emitting unit described in this embodiment will be described with reference to FIGS. 1A and 1B and FIGS. 2A and 2B. Note that, in this embodiment, the light-emitting unit in which three light-emitting elements are connected in series will be described, but the number of the light-emitting elements which are connected is not limited three.

Structural Example 1

Figure 2B:
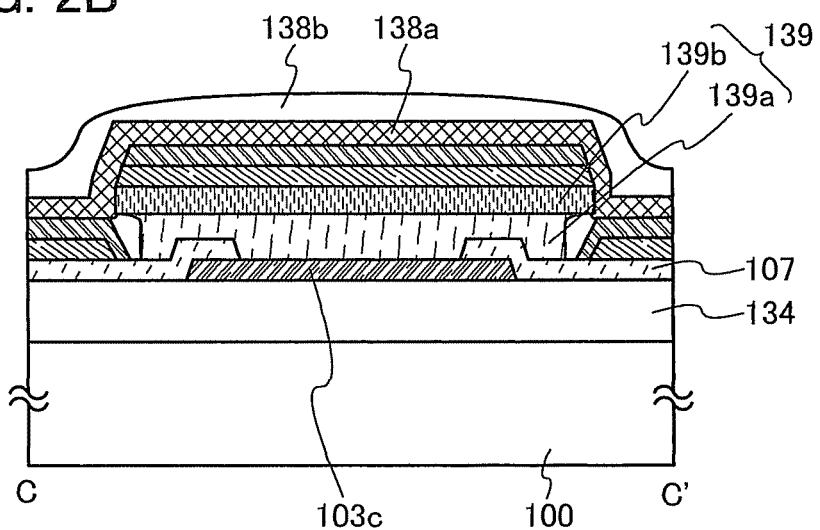

FIG. 1A is a top view of the light-emitting unit, and FIG. 1B is a cross-sectional view along a line A-A' in FIG. 1A. In FIG. 1A, in order to show the drawing simply, the illustration of a planarization layer 134, EL layers 102 (an EL layer 102*a* to an EL layer 102*c*), upper electrodes 108 (an upper electrode 108*a* to an upper electrode 108*c*), and a sealing film 138 are omitted. FIG. 2A is a cross-sectional view along a line B-B' in FIG. 1A. FIG. 2B is a cross-sectional view along a line C-C' in FIG. 1A. The light-emitting unit illustrated in FIGS. 1A and 1B and FIGS. 2A and 2B includes a wiring 133*a*, a wiring 133*b*, a planarization layer 134, a partition wall 107, a first light-emitting element 11, a second light-emitting element 12, a third light-emitting element 13, a separation layer 139 (a leg portion 139*a* and a stage portion 139*b*), a sealing film 138*a*, and a sealing film 138*b*, which are provided over a substrate 100.

The first light-emitting element 11 overlaps with an opening 109 surrounded by the partition wall 107, and includes a lower electrode 103*a* formed over the planarization layer 134, an EL layer 102*a* formed over the lower electrode 103*a*, and an upper electrode 108*a* formed over the EL layer 102*a*.

The second light-emitting element 12 overlaps with an opening 109 surrounded by the partition wall 107, and includes a lower electrode 103b formed over the planarization layer 134, an EL layer 102b formed over the lower electrode 103b, and an upper electrode 108b formed over the EL layer 102b.

The third light-emitting element 13 overlaps with an opening 109 surrounded by the partition wall 107, and includes a lower electrode 103c formed over the planarization layer 134, an EL layer 102c formed over the lower electrode 103c, and an upper electrode 108c formed over the EL layer 102c.

The lower electrode 103a in the first light-emitting element 11 is connected to the wiring 133a. The upper electrode 108c in the third light-emitting element 13 is connected to the wiring 133b through an extraction electrode 160.

In Structural Example 1, the insulating partition wall 107 is provided for the edge portions of the lower electrode 103a to the lower electrode 103c. The upper electrode 108a intersects with an edge portion of the lower electrode 103a with the partition wall 107 interposed therebetween. The upper electrode 108a is directly connected to the lower electrode 103b. Thus, the first light-emitting element 11 and the second light-emitting element 12 are connected in series. Further, the upper electrode 108b intersects with an edge portion of the lower electrode 103b with the partition wall 107 interposed therebetween. The upper electrode 108b and the lower electrode 103c are directly connected to each other. Thus, the second light-emitting element 12 and the third light-emitting element 13 are connected in series. Further, the upper electrode 108c intersects with an edge portion of the lower electrode 103c with the partition wall 107 interposed therebetween. The upper electrode 108c and the electrode 160 are directly connected to each other.

Note that the partition wall 107 has an edge portion with a forward tapered shape. A forward taper refers to a structure in which a layer whose thickness is increased in a gentle angle contacts with a layer serving as a base in a cross section. The angle is referred to as a taper angle. In other words, note that the taper angle refers to an inclination angle formed by a side surface and a bottom surface of a layer with a tapered shape (e.g., the partition wall 107) when the layer is observed from the direction perpendicular to the cross section of the layer (i.e., the plane perpendicular to the surface of the substrate). In the case where the taper angle is smaller than 90°, the angle is referred to as a forward tapered shape, and in the case where the taper angle is greater than or equal to 90°, the angle is referred to as an inverse tapered shape. When the edge portion of the layer has the forward tapered shape, a film formed over the edge portion of the layer can be prevented from being broken (breakage).

A region where the upper electrode 108a is connected to the lower electrode 103b is included in a region where the stage portion 139b of the separation layer 139 protrudes over the lower electrode 103b. In this region, the EL layer 102b formed to suppress entrance is not formed over the lower electrode 103b, and only the upper electrode 108a formed to promote entrance is formed to be in contact with the lower electrode 103b.

Thus, the first light-emitting element 11 and the second light-emitting element 12 are connected in series, so that the light-emitting unit with high driving voltage can be provided. The same can be said for the second light-emitting element 12 and the third light-emitting element 13.

The partition wall 107 is provided to cover the edge portion of the lower electrode 103a in the first light-emitting element 11. Thus, a short circuit between the lower electrode 103a and the upper electrode 108a at a step portion formed at the edge portion of the lower electrode 103a can be prevented, whereby the light-emitting unit with high reliability can be provided. Moreover, when a partition wall is provided over the lower electrode 103a, a short circuit between the lower electrode 103a and the upper electrode 108a in a region where the lower electrode 103a and the upper electrode 108b overlap with the stage portion 139b can be prevented. The same can be said for the second light-emitting element 12 and the third light-emitting element 13.

In Structural Example 1, a void 141 (an empty space) is provided. It is more preferable to introduce a dry agent to the void 141.

In Structural Example 1, the separation layer 139 is formed by the leg portion 139a and the stage portion 139b. Further, the separation layer 139 has the stage portion 139b whose projected area with respect to the lower electrode 103 is larger than the area of a region where the leg portion 139a is in contact with the lower electrode 103 and the partition wall 107. That is, the stage portion 139b is formed to protrude outside the region where the leg portion 139a is in contact with the lower electrode 103 and the partition wall 107.

By providing the sealing film 138a and the sealing film 138b which cover a top surface of the light-emitting elements, the light-emitting unit with high reliability can be provided.

Further, a base film may be formed over the substrate. The sealing films and the base film have a function of protecting the light-emitting elements from water or the like from the outside. By providing the sealing films and the base film, the deterioration of the light-emitting elements is reduced and the durability and lifetime of the lighting unit can be improved.

<Shape of Lower Electrode>

Here, by carefully designing a shape of one edge portion of a lower electrode, physical and electrical contact between the lower electrode and an upper electrode can be favorable even when an EL layer is provided between the lower electrode and the upper electrode.

Figure 3:
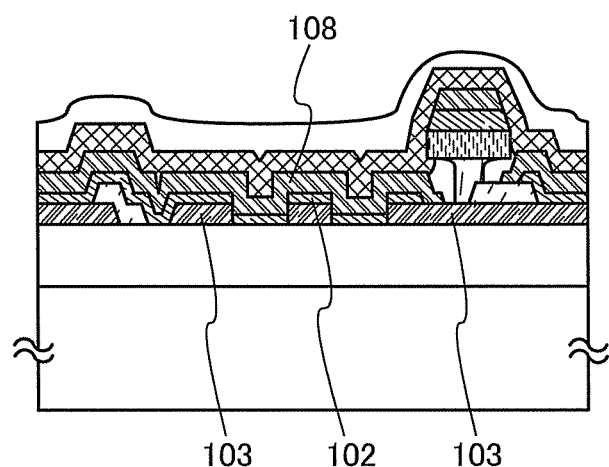
FIG. 3 is a cross-sectional view illustrating a shape of a first electrode of a light-emitting unit.

An edge portion of a lower electrode 103 illustrated in FIG. 3 is processed to have a plurality of steps. At such a step, an EL layer 102 with a relatively small thickness can be divided by being broken at the step. On the other hand, an upper electrode 108 formed over the EL layer 102 is formed to have a thickness larger than that of the EL layer 102, whereby the upper electrode 108 can cover the steps without being divided. Thus, the lower electrode 103 and the upper electrode 108 can be directly in contact with each other at a side surface of the step where the EL layer 102 is divided, so that the electrical contact can be favorable.

Note that depressed portions are provided in parts of the edge portion of the lower electrode in FIG. 3; however, the edge portion may have an appropriate shape, for example, the edge portion of the lower electrode may have a comb-like shape so that the EL layer can be efficiently divided and the lower electrode can be covered with the upper electrode without the upper electrode being divided.

Structural Example 2

Figure 6A:
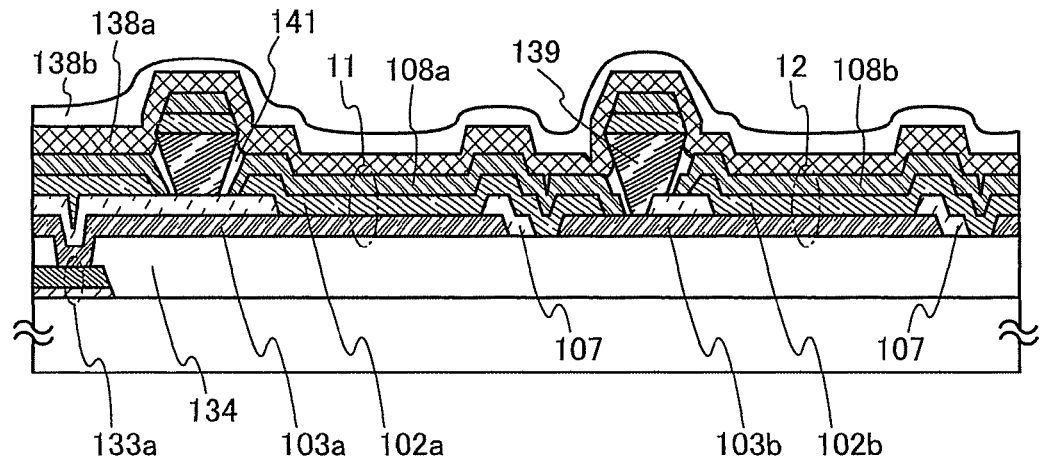
FIGS. 6A and 6B are cross-sectional views each illustrating a light-emitting unit.

FIG. 6A is a cross-sectional view of a light-emitting unit having a structure different from that of Structural Example 1. A light-emitting unit illustrated in FIG. 6A includes the wiring 133a, the planarization layer 134, the partition wall 107, the first light-emitting element 11, the second light-emitting element 12, the separation layer 139, the sealing film 138a, and the sealing film 138b, which are provided over the substrate 100.

The structure of the separation layer 139 in Structural Example 2 differs from that in Structural Example 1. In Structural Example 1, the leg portion 139a and the stage portion 139b of the separation layer 139 are formed of different materials; however, the separation layer 139 in Structural Example 2 is formed of one type of material. Structural Example 2 has a structure similar to that of Structural Example 1 except the separation layer 139.

Structural Example 3

Figure 6B:
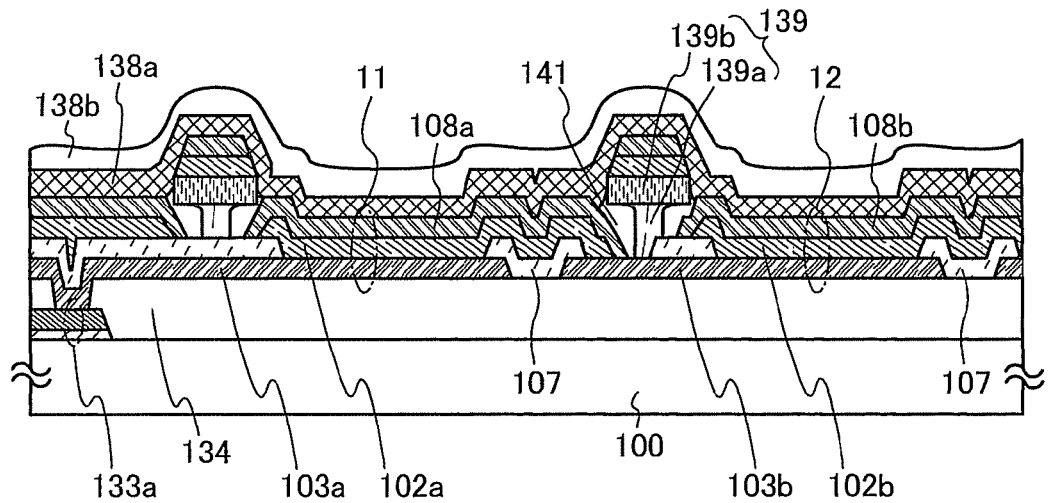

FIG. 6B is a cross-sectional view of a light-emitting unit having a structure different from that of Structural Example 1 and Structural Example 2. A light-emitting unit illustrated in FIG. 6B includes the wiring 133a, the planarization layer 134, the partition wall 107, the first light-emitting element 11, the second light-emitting element 12, the separation layer 139, the sealing film 138a, and the sealing film 138b, which are provided over the substrate 100.

Each light-emitting element includes a lower electrode formed over the planarization layer 134, an EL layer formed over the lower electrode, and an upper electrode formed over the EL layer.

The structure of the partition wall 107 in Structural Example 3 is different from that in Structural Example 1 and Structural Example 2. In Structural Example 3, the partition wall 107 is provided so that the partition wall 107 covers the edge portion of the lower electrode 103a and the lower electrode 103b which is adjacent to the edge portion of the lower electrode 103a. Thus, a short circuit between the lower electrode 103a and the upper electrode 108a can be prevented at a step portion formed in the edge portion of the lower electrode 103a and the edge portion of the lower electrode 103b, whereby the light-emitting unit with high reliability can be provided. Further, even in the case where the upper electrode 108a is thin, the upper electrode 108a is difficult to break at a step portion formed at the edge portion of the lower electrode 103b, whereby the light-emitting unit with high reliability can be provided.

Moreover, by providing the partition wall over the lower electrode 103b, a short circuit between the lower electrode 103b and the upper electrode 108b in a region where the lower electrode 103b overlap with the stage portion 139b can be prevented.

Further, in the light-emitting unit described in Structural Example 1 to Structural Example 3, a plurality of EL layers and a plurality of upper electrodes can be formed without using a metal mask. Therefore, defects caused by damage of a surface of the substrate due to an edge of an opening in the metal mask can be prevented; thus, the light-emitting unit with high reliability can be provided. Moreover, there are effects of reducing a manufacturing cost and a cleaning cost for the unnecessary metal mask.

<<Material>>

Examples of materials that can be used for a light-emitting unit, which is one embodiment of the present invention, will be described below.

[Substrate]

In the case where a structure of a light-emitting element included in a light-emitting unit is a structure in which light emitted from the light-emitting element is extracted from the substrate 100 side (a bottom emission structure), a material with a light-transmitting property, such as glass, quartz, or an organic resin, can be used for the material of the substrate 100.

For example, when an organic resin is used for the substrate 100, for example, a polyester resin such as polyethylene terephthalate (PET) or polyethylene naphthalate (PEN), a polyacrylonitrile resin, a polyimide resin, a polymethylmethacrylate resin, a polycarbonate (PC) resin, a polyethersulfone (PES) resin, a polyamide resin, a cycloolefin resin, a polystyrene resin, a polyamide imide resin, a polyvinylchloride resin, or the like can be used as an organic resin. Further, a substrate in which a glass fiber is impregnated with an organic resin or a substrate in which an inorganic filler is mixed with an organic resin can also be used.

In the case where a structure of the light-emitting element is a structure in which light emitted from the light-emitting element is extracted from the side opposite to the substrate 100 (a top emission structure), a material with a light-shielding property other than the above materials can also be used for the material of the substrate 100. For example, a metal material such as aluminum, copper, iron, nickel, an aluminum alloy, stainless steel, or the like can be used. Further, as the substrate 100, a semiconductor substrate of silicon, germanium, or the like can also be used.

In particular, by using a material having high thermal conductance such as a metal material for the substrate 100, the heat generated in the light-emitting element can be efficiently released, whereby the reliability of the light-emitting unit can be increased. That is, when the structure of the light-emitting element is a top emission structure, it is not necessary to use a light-transmitting substrate as the substrate 100; therefore a material having high thermal conductance such as a metal material can be used for the substrate 100, and the heat generated in the light-emitting element can be efficiently released. When the wiring 133a and the wiring 133b are not desired to be in direct contact with the substrate 100, an insulating film may be provided between the wiring 133a and the substrate 100, and between the wiring 133b and the substrate 100.

[Sealing Film and Base Film]

Each of the sealing film and the base film can be formed using a material with a barrier property.

As each of the sealing film and the base film, an inorganic insulating film can be formed by a sputtering method, for example. For example, a silicon nitride film, an aluminum oxide film, a silicon oxide film, or the like may be formed.

The sealing film is preferably a gas barrier film in which permeability of moisture is lower than or equal to $10^{-6}$ g/m$^2$·day, for example. A stacked-layer structure in which at least one layer containing an inorganic material is interposed between layers containing an organic material can be used for the sealing film, for example. As the layer containing an organic material, an adhesive layer such as an epoxy-based adhesive layer can be given as an example. As the layer containing an inorganic material, a film with a barrier property, such as a silicon oxide film or a silicon nitride film can be given as an example.

Specifically, a thermosetting resin (e.g., an epoxy-based adhesive) is applied to a film to be a supporting body to a thickness of several tens of micrometers and dried, and an inorganic film (e.g., a silicon oxide film) is formed to a thickness of several micrometers thereover to form a first member; thermosetting epoxy resin is applied to a mold release film and dried to form a second member; and the first member and the second member are bonded to each other, so that a stack is formed. Next, a surface of the stack from which the mold release film is removed is bonded to a top surface of the above-described light-emitting element so as to face each other, thermocompression is performed, and then the epoxy resin may be cured by heat. With such a structure, the deterioration of the light-emitting element is suppressed and the durability and lifetime of the light-emitting unit can be improved.

When an organic resin is used for a substrate, a glass layer with a thickness greater than or equal to 25 μm and less than or equal to 100 μm may be used. The thickness of the glass layer is typically greater than or equal to 45 μm and less than or equal to 80 μm. By combining an organic resin substrate and a glass layer, moisture, an impurity, or the like can be prevented from entering an organic compound or a metal material included in the light-emitting element from the outside of the light-emitting unit, and the weight of the light-emitting unit can be reduced.

[Separation Layer]

A separation layer can be formed using an inorganic insulating material or an organic insulating material. For example, a negative type photosensitive resin material can be used.

[Light-Emitting Element]

The lower electrode is provided on the side opposite to the side where light is extracted and is formed using a reflective material. As the reflective material, a metal material such as aluminum, gold, platinum, silver, nickel, tungsten, chromium, molybdenum, iron, cobalt, copper, or palladium can be used. In addition, any of the following can be used: alloys containing aluminum (aluminum alloys) such as an alloy of aluminum and titanium, an alloy of aluminum and nickel, and an alloy of aluminum and neodymium; and an alloy containing silver such as an alloy of silver and copper. An alloy of silver and copper is preferable because of its high heat resistance. Further, a metal film or a metal oxide film is stacked on an aluminum alloy film, whereby oxidation of the aluminum alloy film can be prevented. As examples of a material for the metal film or the metal oxide film, titanium, titanium oxide, and the like are given.

An EL layer at least includes the layer containing a light-emitting organic compound. The EL layer can have a stacked structure in which a layer containing a substance having a high electron-transport property, a layer containing a substance having a high hole-transport property, a layer containing a substance having a high electron-injection property, a layer containing a substance having a high hole-injection property, a layer containing a bipolar substance (a substance having a high electron-transport property and a high hole-transport property), and the like in addition to the layer containing a light-emitting organic compound are combined as appropriate.

Further, in one embodiment of the present invention, a light-emitting element (a tandem light-emitting element) in which a plurality of EL layers are stacked between a lower electrode and an upper electrode can be used. A stacked-layer structure of two layers, three layers, or four layers (in particular, a stacked-layer structure of three layers) is preferably used. Examples of structures of the EL layer will be described in detail in other Embodiments.

As a conductive material for the upper electrode, indium oxide, an alloy of indium oxide and tin oxide (ITO), an alloy of indium oxide and zinc oxide, zinc oxide, zinc oxide to which gallium is added, graphene, or the like can be used.

In addition, for the upper electrode, a metal material such as gold, platinum, nickel, tungsten, chromium, molybdenum, iron, cobalt, copper, palladium, or titanium can be used. Further, a nitride of the metal material (e.g., titanium nitride) or a material including oxide may be used. In the case of using the metal material (or the nitride thereof or the material including oxide), the upper electrode may be thinned so as to be able to transmit light. Alternatively, graphene can be used for the upper electrode.

The thickness of the upper electrode is for example, greater than or equal to 50 nm and less than or equal to 300 nm, preferably greater than or equal to 80 nm and less than or equal to 130 nm, more preferably greater than or equal to 100 nm and less than or equal to 110 nm.

[Wiring]

For the wiring, a single layer or a stacked layer using a material selected from copper (Cu), titanium (Ti), tantalum (Ta), tungsten (W), molybdenum (Mo), chromium (Cr), neodymium (Nd), scandium (Sc), and nickel (Ni) or an alloy material including any of these materials as its main component can be used. Aluminum can also be used for the material of the wiring; however, in that case, Aluminum might be oxidized and the resistance value might increase when Aluminum is provided to be in direct contact with a metal oxide conductive film such as ITO. Therefore, it is preferable that the wiring include a stacked-layer structure and aluminum be used in a layer which is not in contact with ITO or the like. The wiring of this embodiment includes a stacked layer in which a copper film is formed over a titanium film. Copper can be preferably used because of its low resistance. The thickness of the wiring is preferably greater than or equal to 2 μm and less than or equal to 35 μm.

[Planarization Layer]

The planarization layer 134 can be formed using an inorganic insulating material or an organic insulating material. Note that the planarization layer 134 formed using a heat-resistant organic insulating material such as an acrylic resin, a polyimide, a benzocyclobutene-based resin, a polyamide, or an epoxy resin is preferably used as a planarization insulating film. Other than such organic insulating materials, it is possible to use a low-dielectric constant material (a low-k material), a siloxane based resin, phosphosilicate glass (PSG), borophosphosilicate glass (BPSG), or the like. Note that the planarization layer 134 may be formed by stacking a plurality of insulating films formed using any of these materials.

A method for forming the planarization layer 134 is not particularly limited, and a sputtering method, a spin coat method, a dipping method, a printing method, an inkjet method, or the like can be used depending on its material.

[Partition Wall]

For a material of the partition wall, an organic resin such as polyimide, acrylic resin, polyamide, or epoxy resin or an inorganic insulating material can be used, for example.

The taper angle of the end portions of the partition wall is greater than or equal to 10° and less than or equal to 85°, preferably greater than or equal to 60° and less than or equal to 80°. It is particularly preferable that the partition wall be formed using a photosensitive resin material to have the opening 109 over the lower electrode so that a sidewall of the opening 109 is formed as an inclined surface with continuous curvature. Specifically, the radius of curvature of a curve drawn by a cross section of an insulating film is desirably greater than or equal to 0.2 μm and less than or equal to 2 μm.

A method for forming the partition wall is not particularly limited, and a sputtering method, an evaporation method, a droplet discharging method (e.g., an inkjet method), a printing method (e.g., a screen printing method or an off-set printing method), or the like may be used.

The thickness of the partition wall may be for example, greater than or equal to 20 nm and less than or equal to 200 nm, preferably greater than or equal to 50 nm and less than or equal to 100 nm.

This embodiment can be freely combined with other embodiments.

(Embodiment 2)

In this embodiment, a method for manufacturing the light-emitting unit of one embodiment of the present invention described in any of the above embodiments will be described with reference to cross-sectional views illustrated in FIGS.

4A to 4E. Note that two adjacent light-emitting elements of the plurality of light-emitting elements connected in series which are described in FIGS. 1A and 1B are illustrated in FIGS. 4A to 4E for simplicity, and are described. In addition, shapes which can be used for the separation layer 139 will be described with reference to FIGS. 5A to 5C.

Structural Example 1

First, a conductive film for forming the wiring is formed over the substrate 100. The conductive film can be formed with the use of a film formation method such as a sputtering method. Then, a known, semiconductor processing technique is used to remove unnecessary portions of the conductive film, so that the wiring 133a and the wiring 133b which is not illustrated in FIGS. 4A to 4E (see FIGS. 1A and 1B) are formed.

Next, the planarization layer 134 covering the wiring 133a and the wiring 133b is formed. There is no particular limitation on a method for forming the planarization layer 134, and the planarization layer 134 can be formed with the use of a method such as a sputtering method, an SOG method, spin coating, dipping, spray coating, a droplet discharge method (e.g., an inkjet method), a printing method (e.g., a screen printing method, or an off-set printing method), or the like. Then, openings 135 each reaching the wiring 133a and the wiring 133b are formed (not shown).

Next, a conductive film connecting to the wiring 133a and the wiring 133b through the openings is formed, and then the lower electrode 103a, the lower electrode 103b, and the extraction electrode 160 which is not shown in FIGS. 4A to 4E (see FIGS. 1A and 1B) are formed with the use of a known semiconductor processing technique.

Figure 4A:
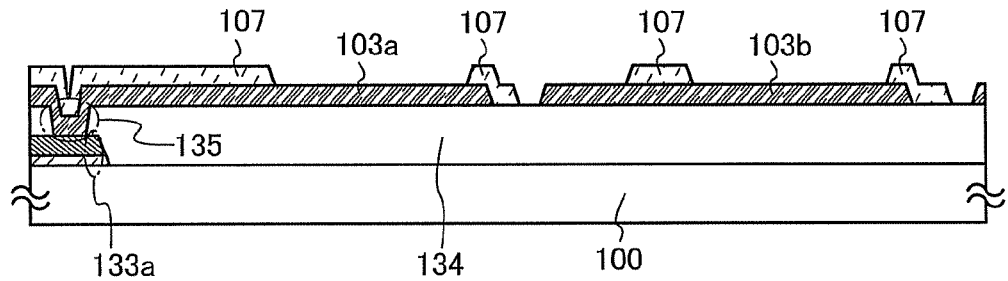
FIGS. 4A to 4E are cross-sectional views illustrating manufacturing steps of a light-emitting unit.

Then, the partition wall 107 covering one of edge portions of the lower electrode 103a and one of edge portions of the lower electrode 103b, and the partition wall 107 over the lower electrode 103a and the lower electrode 103b are formed at the same time (FIG. 4A).

Next, the separation layer 139 is formed over the lower electrode 103a and the lower electrode 103b.

The separation layer 139 includes the leg portion 139a and the stage portion 139b. The separation layer 139 is formed so that the area of a region where the stage portion 139b is projected over the lower electrode 103b is larger than the area of a region where the leg portion 139a is in contact with the lower electrode 103b and the partition wall 107 formed over the lower electrode 103b. This processing is preferably performed through one patterning step.

Figure 4B:
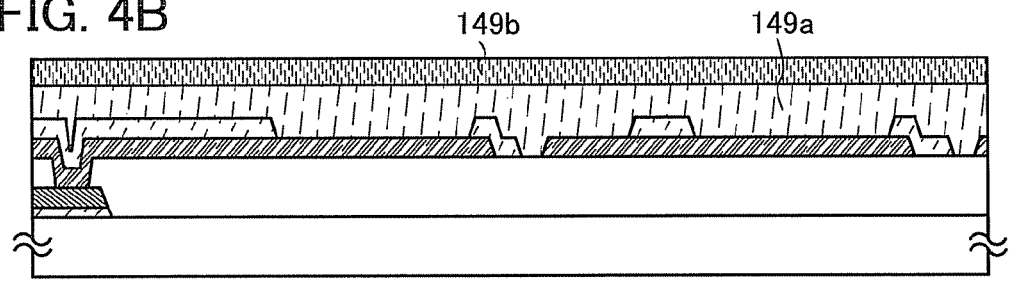

First, an insulating film 149a which is to be the leg portion 139a later and an insulating film 149b which is to be the stage portion 139b later are formed in this order (FIG. 4B).

In this embodiment, a negative type photosensitive organic resin film is used for the insulating film 149a and the insulating film 149b. For the insulating film 149a, a material with a lower photosensitivity to light used for light exposure than that of the insulating film 149b is used. The difference in these photosensitivities means that the diameter of a pattern of the insulating film 149a with a low photosensitivity becomes smaller than that of the insulating film 149b when the insulating films 149a and 149b are irradiated with light with the same intensity.

Figure 4C:
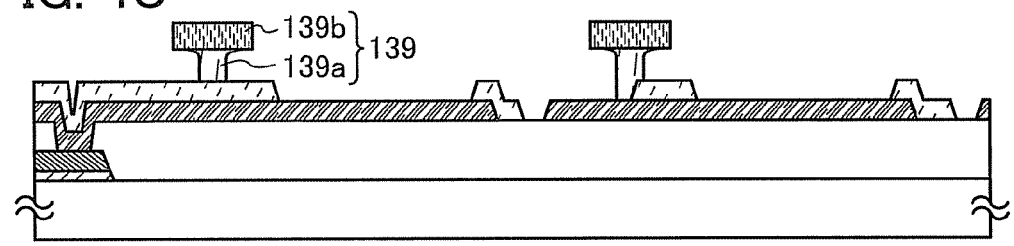

After the insulating film 149a and the insulating film 149b are formed, the insulating films 149a and 149b are selectively irradiated with light. Then, development treatment is performed, so that the separation layer 139 including the leg portion 139a and the stage portion 139b is formed (FIG. 4C). At this time, the separation layer 139, because of the difference in the photosensitivities, has a shape in which the area of a region where the leg portion 139a is in contact with the lower electrode 103b and the partition wall 107 formed over the lower electrode 103b is smaller than an area of a region on which the stage portion 139b is projected.

Note that exposure treatment may be performed plural times. For example, exposure treatment may be performed twice with the use of two kinds of wavelength.

Figure 4D:
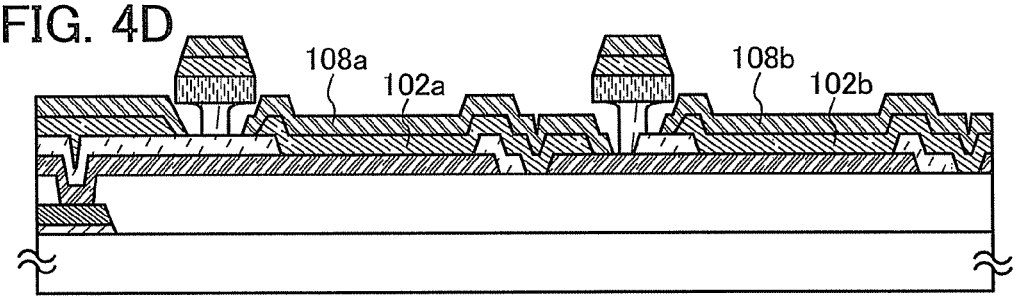

Next, an EL layer and a conductive layer which is to be an upper electrode is formed. At this time, part of the EL layer and the conductive layer which are formed is physically divided by the separation layer 139, whereby the EL layers 102a and 102b which are electrically divided and the upper electrodes 108a and 108b which are electrically divided are formed (FIG. 4D). That is, a plurality of EL layers and a plurality of upper layers can be formed over the substrate without using the metal mask.

The upper electrode is formed so that the upper electrode enters a portion directly under the stage portion 139b that is a protruded portion of the separation layer 139 and covers the EL layer formed just before the upper electrode. When the upper electrode is formed in such a manner, an edge portion of the upper electrode crosses over the EL layer and is in contact with the lower electrode in a region where the upper electrode overlaps with the stage portion 139b; thus, the upper electrode is electrically connected to the lower electrode. Further, the other edge portion of the upper electrode is formed so as to be in contact with the partition wall 107 overlapping with the stage portion 139b.

For a film formation method of the EL layer, an evaporation method or the like can be used. For a film formation method of the upper electrode, an evaporation method, a sputtering method, or the like can be used. As a sputtering method, other than a magnetron sputtering method, a mirrortron sputtering method is preferably used because the amount of entrance of the EL layer can be increased.

In order to form the upper electrode so as to cover the EL layer as described above, the distance between a deposition source and the substrate is set as appropriate. For example, when the distance between the deposition source and the substrate is large, the amount of the upper electrode entering a region under the protruded portion of the stage portion 139b can be reduced. On the other hand, when this distance is small, the amount of the upper electrode entering the region under the protruded portion of the stage portion 139b can be increased. Therefore, when the EL layer is formed, the distance between the deposition source and the substrate is made large so that the amount of entrance of the EL layer is reduced. On the other hand, when the upper electrode is formed, the distance between the deposition source and the substrate is made small.

As described above, the first light-emitting element 11 and the second light-emitting element 12, which are connected in series, can be formed over the substrate 100.

Figure 4E:
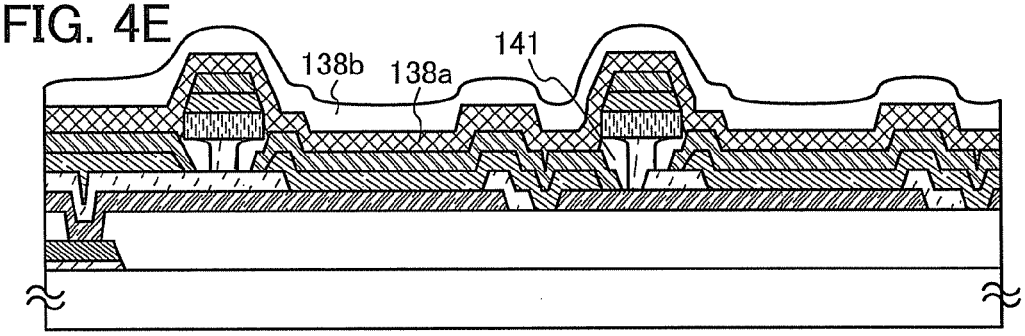

Next, the sealing film 138a and the sealing film 138b, which cover the whole components over the substrate 100 are formed (FIG. 4E). As the sealing film 138a, a film with a barrier property to an impurity such as moisture causing deterioration of the light-emitting element can be used. For example, an inorganic insulating film formed by a sputtering method can be used.

When the sealing film 138a is formed, the void 141 is formed in a region directly under the protruded portion of the stage portion 139b of the separation layer 139 in some cases. However, since the sealing film 138a is formed to cover the whole components over the substrate 100, the void 141 does not adversely affect the reliability of the light-emitting elements.

Further, the void 141 may be filled with a dry agent. For example, before the sealing film 138a is formed, a solution containing a dry agent is dropped to a region where the stage portion 139b of the separation layer 139 protrudes and overlaps with the void by a droplet discharge method or the like, and dried. Here, it is preferable that a solvent for the solution, which is used, does not include moisture.

As the sealing film 138b, any of the sealing films described as an example in the above embodiment can be used as appropriate. For example, a film including an epoxy resin is bonded to the substrate 100 and subjected to thermocompression bonding, so that the sealing film 138b can be formed.

Note that in this embodiment, a method using two kinds of organic resin films having different photosensitivities is described as the formation method for the separation layer 139; however, other manufacturing methods can also be used.

For example, the insulating film 149a can be formed using an inorganic insulating film, and the insulating film 149b can be formed using a photosensitive organic film. First, exposure treatment, development treatment, and the like are performed and unnecessary portions of the insulating film 149b are removed; thus, the stage portion 139b is formed. Then, the stage portion 139b is used as a mask and the insulating film 149a is etched, so that the leg portion 139a is formed. At this time, conditions such as etching time or the like are adjusted as appropriate so that the projected area with respect to the lower electrode 103 of the leg portion 139a, which is formed, is smaller than that of the stage portion 139b. For the etching of the insulating film 149a, a method which causes less damage to the exposed lower electrode 103 and the exposed partition wall 107 due to etching is preferably used.

Alternatively, the insulating film 149a and the insulating film 149b are formed using a combination of inorganic materials with different etching rates. Typically, a combination of a silicon oxide film and a silicon nitride film is given; however, the combination is not limited to this, and a combination of films selected from an insulating film containing silicon, germanium, or the like; an organic insulating film; a metal oxide insulating film; and the like can be used as appropriate. First, a resist mask is formed over the insulating film 149b by a photolithography method, and the insulating film 149b is etched under a condition in which the etching rate of the insulating film 149a is low, so that the stage portion 139b is formed, and then the resist mask is removed. Then, the stage portion 139b is used as a mask, and the insulating film 149a is etched under a condition in which the etching rate of the film for forming the stage portion 139b is low; thus, the leg portion 139a is formed. The resist mask may be removed after the stage portion 139b is formed or after the leg portion 139a is formed, or the resist mask can be left without being removed and can remain. As for a method for etching, it is preferable to give consideration to damage to a lower layer due to etching as described above.

The insulating film 149a and the insulating film 149b may be formed using organic resin films having opposite photosensitivity. For example, the insulating film 149a can be formed using an organic resin film with a positive photosensitivity, and the insulating film 149b can be formed using an organic resin film with a negative photosensitivity. In this case, the insulating film 149a is formed and subjected to selective exposure treatment, development treatment, heat treatment, and the like; thus, the leg portion 139a is formed. Next, the insulating film 149b is formed and subjected to selective exposure treatment, development treatment, heat treatment, and the like; thus, the stage portion 139b is formed. Consequently, the separation layer 139 can be formed.

Further, a photosensitive organic film and an inorganic insulating film may be used as the insulating film 149a and the insulating film 149b, respectively. First, a stacked-layer film of the insulating film 149a and the insulating film 149b is formed, and the insulating film 149b is etched by a photolithography method, so that the stage portion 139b is formed. Next, the stage portion 139b is used as a hard mask, and the insulating film 149a is etched so as to be inversely tapered; thus, the leg portion 139a is formed. Here, when etching the insulating film 149a, dry etching is preferably used, in which case the shape of the leg portion 139a can be easily controlled.

The manufacturing method of the separation layer 139 is not limited to the above-described methods. As the insulating film 149a and the insulating film 149b, films selected from a negative photosensitive organic film, a positive photosensitive organic film, an inorganic insulating film, and the like are combined as appropriate. In the above, the case where the separation layer 139 has a two-layer structure is shown; however, the separation layer 139 can have a single-layer structure or a stacked-layer structure of two or more layers.

As described above, the separation layer 139 can be formed by a various manufacturing methods. Therefore, the separation layer 139 may have various shapes depending on a difference in the manufacturing methods. Hereinafter, a shape which can be used for the separation layer 139 will be described with reference to FIGS. 5A to 5C.

Figure 5A:
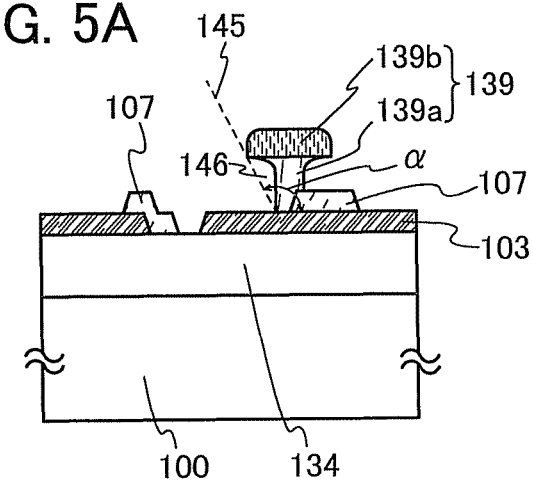
FIGS. 5A to 5C are cross-sectional views illustrating shapes which can be used for a separation layer.

The separation layer 139 illustrated in FIG. 5A includes the leg portion 139a and the stage portion 139b, which are formed of different insulating films. Cross-sections of the leg portion 139a and the stage portion 139b are substantially quadrangular, and the area where the stage portion 139b is projected over the lower electrode 103b is larger than the area where the leg portion 139a is in contact with the lower electrode 103 and the partition wall 107 formed over the lower electrode 103. Note that an upper edge of the cross-sections of the stage portion 139b may be rounded. An upper portion of the leg portion 139a extends as illustrated in FIG. 5A.

Figure 5B:
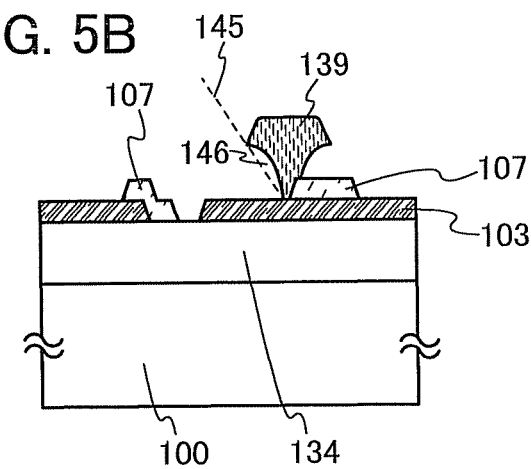

The separation layer 139 illustrated in FIG. 5B is formed of a single insulating film. In a cross section of the separation layer 139, a prism curves from the middle to the lower portion. Further, an upper portion of the prism protrudes horizontally to the lower portion. Note that an upper edge may be rounded as described above.

Figure 5C:
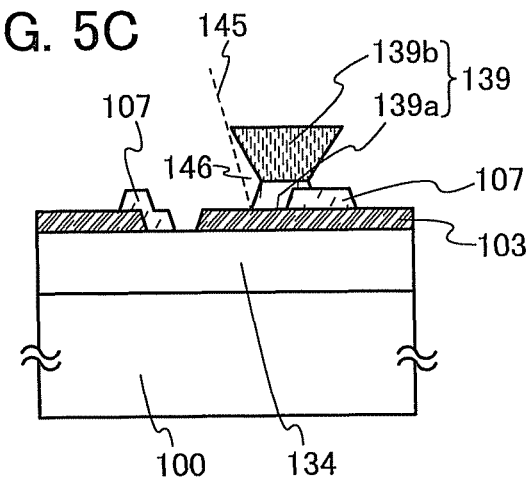

The separation layer 139 illustrated in FIG. 5C includes the leg portion 139a and the stage portion 139b, which are formed of different insulating films. Cross sections of the leg portion 139a and the stage portion 139b are substantially trapezoidal. When the separation layer 139 is seen from the above, a projected area of the bottom portion of the leg portion 139a is larger than that of the upper portion. On the other hand, the projected area of the bottom portion of the stage portion 139b is smaller than that of the upper portion. Moreover, there is a feature in that the area of the bottom portion of the leg portion 139a is smaller than the area of the upper portion of the stage portion 139b.

Here, the separation layer 139 illustrated in FIGS. 5A to 5C have the following common features. As shown by dashed lines in FIGS. 5A to 5C, in each of the separation layers 139, a space 146 is provided on the leg portion side of a straight line 145 connecting a tip of the upper portion (or the stage portion) of the separation layer 139, and a point where a side surface of a lower portion (or the leg portion) of the separation layer 139 is in contact with the lower electrode 103. By providing such a curved portion, a film formation method in which entrance of the EL layer is suppressed can be used when the EL layer is formed, and a film formation method in which entrance of the upper electrode is promoted can be used when the upper electrode is formed; therefore, the upper electrode and the lower electrode can be easily electrically connected to each other.

A taper angle of the separation layer 139 can be regarded as an inclination angle α formed by a straight line 145 and a bottom surface of the separation layer 139 which is in contact with a top surface of the lower electrode 103 or a bottom surface of the separation layer 139 which is in contact with a top surface of the partition wall 107.

For the Structural Examples other than Structural Example 1 described as examples in the above embodiment, a manufacturing method similar to that in Structural Example 1 can be used. Differences in the manufacturing method between Structural Example 1 and the other Structural Examples are given below.

Structural Example 2

The shape of the separation layer 139 in Structural Example 2 (see FIG. 6A) is different from that in Structural Example 1. An organic film with a negative photosensitivity is formed and subjected to exposure treatment and development treatment, whereby the separation layer 139 can be formed. Here, the intensity of the exposure is adjusted so that the intensity decreases toward a lower portion of the organic film, whereby the influence of light entering a lower portion of the separation layer 139 is increased and the separation layer 139 can have a so-called inversely tapered shape.

Structural Example 3

Structural Example 3 (see FIG. 6B) is different from Structural Example 1 in that the partition wall 107 covers the edge portion of the lower electrode 103a and the edge portion of the lower electrode 103b, which is adjacent to the edge portion of the lower electrode 103a. Thus, the partition wall 107 may be, formed to have a shape which covers the adjacent edge portions of the lower electrode.

In the manufacturing method of this embodiment, a layer, in which two kinds of photosensitive resins having different photosensitivities are stacked, is subjected to selective exposure and development, whereby the separation layer 139 is formed. In addition, the EL layer 102 is formed to suppress entrance, and the upper electrode 108 is formed to promote entrance of the upper electrode. In such a manner, the separation layer 139 including the stage portion 139b protruding over the upper electrode 108 beyond the leg portion 139a can be easily formed. In addition, the EL layer 102 is formed between the lower electrode 103 and the upper electrode 108 without using a metal mask, and the upper electrode 108 and the lower electrode 103 (the upper electrode 108a and the lower electrode 103h in FIG. 6B) can be electrically connected to each other in a region where the upper electrode and the lower electrode overlap with the stage portion 139b. Since the manufacturing method of this embodiment is a method for manufacturing a plurality of EL layers and a plurality of upper electrodes without using a metal mask, defects caused by damage of a surface of the substrate due to an edge of an opening in the metal mask can be prevented; thus, the light-emitting unit with high reliability can be provided. Moreover, there are effects of reducing a manufacturing cost and a maintenance cost such as cleaning cost for the unnecessary metal mask.

This embodiment can be freely combined with other embodiments.

(Embodiment 3)

In this embodiment, one example of a light-emitting device including any of the light-emitting units described as one embodiment of the present invention in the above embodiments will be described with reference to FIGS. 7A to 7C and FIGS. 8A and 8B.

Figure 7A:
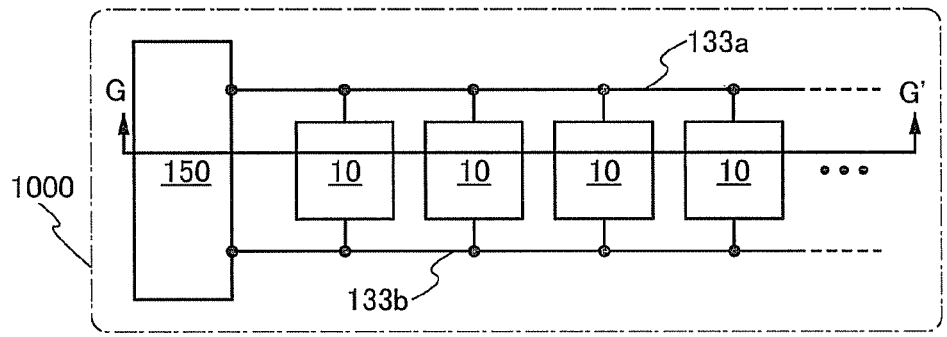
FIGS. 7A to 7C are diagrams illustrating a structure of a light-emitting device.

FIG. 7A is a schematic view of a structure of a light-emitting device 1000. The light-emitting device 1000 includes a converter 150 and a plurality of light-emitting units 10. The plurality of light-emitting units 10 are connected in parallel, and each of the light-emitting units 10 is connected to the wiring 133a and the wiring 133b, which are connected to the converter 150.

For the converter 150, for example, an AC-DC converter which converts a voltage output from an alternating-current power source for home use into a direct-current voltage, a DC-DC converter which outputs a direct-current voltage whose level is different from a level of an input direct-current voltage, or the like, can be used. Different voltages are output to the wiring 133a and the wiring 133b, which are connected to the converter 150. Current flows to the light-emitting units 10 by this voltage difference between the wiring 133a and the wiring 133b, so that the light-emitting units 10 emit light.

The number of the plurality of light-emitting units 10 connected in parallel may be set as appropriate depending on the output characteristics of the converter 150. The number of the light-emitting units 10 connected in parallel can increase as the amount of current that flows from the converter 150 increases.

Figure 7B:
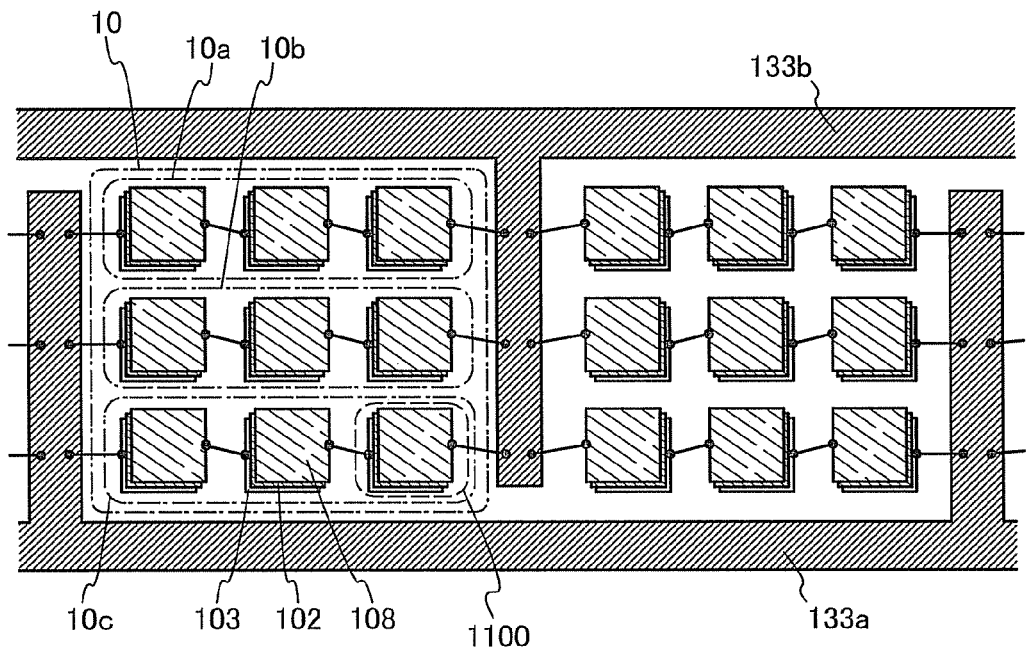
Figure 7C:
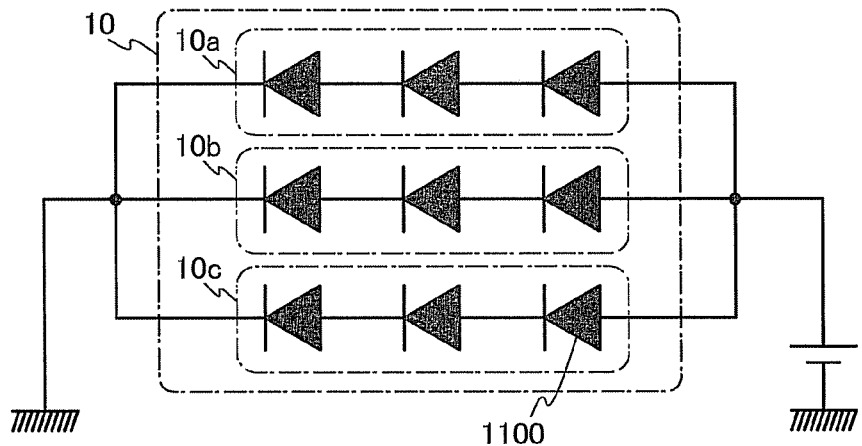

Next, a structure of the light-emitting unit 10 will be described with reference to FIGS. 7B and 7C. FIG. 7B is a schematic view illustrating the structure and the connection relation of the light-emitting units 10. FIG. 7C illustrates an equivalent circuit for describing the connection relations of a plurality of light-emitting elements in the light-emitting unit 10.

A light-emitting unit 10a, a light-emitting unit 10b, and a light-emitting unit 10c illustrated in FIG. 7B each include the plurality of light-emitting elements 1100 and each connect to the wiring 133a and the wiring 133b. In this embodiment, the light-emitting unit 10 with a structure in which the nine light-emitting elements 1100 are arranged in matrix in the row direction and the column direction, is described as an example. The number of the light-emitting elements 1100 provided in the light-emitting unit 10 may be set as appropriate depending on the output characteristics of the converter 150, a layout of the light-emitting device 1000, or the like.

Any of the light-emitting elements described as examples in the above embodiments can be used as the light-emitting elements 1100, and each of the light-emitting elements 1100 include the lower electrode 103, the EL layer 102, and the upper electrode 108.

The light-emitting units 10a to 10c include the plurality of light-emitting elements 1100 which are connected in series in the row direction. Specifically, the upper electrode in any of the light-emitting elements 1100 arranged in the row direction is connected to the lower electrode in the adjacent light-emitting element 1100, and this structure is repeated; thus, the light-emitting elements 1100 are connected in series. The light-emitting element 1100, which is connected in series, can be connected with the use of any of the methods and the structures described as examples in the above embodiments. In addition, the light-emitting units 10a to 10c are connected in parallel in the column direction.

In FIG. 7B, the two light-emitting units 10 are provided symmetrically. With such a structure, the light-emitting units 10 can share part of the wiring 133a and part of the wiring 133b, which are connected to the light-emitting elements, so that a space between the light-emitting units 10 can be small; therefore, the area of light emission with respect to the area of the substrate can be large.

FIG. 7C illustrates the equivalent circuit showing the above-described connection relation. By connecting the groups, in each of which the light-emitting elements 1100 are connected in series, in parallel in such a manner, even in the case where one of the light-emitting elements 1100 in the light-emitting unit 10 is short-circuited, light can be emitted without blocking the flow of current through the other light-emitting elements.

In this embodiment, the groups each including the light-emitting elements connected in series are connected in parallel. However, a structure may be employed in which in the light-emitting elements adjacent to each other in the column direction, the lower electrode and the upper electrode of the light-emitting element are respectively connected to the lower electrode and the upper electrode of the adjacent light-emitting element, so that the light-emitting elements are connected in parallel in the column direction. As described above, with a connection relation combining a series connection and a parallel connection, even when one of the light-emitting elements 1100 in the light-emitting unit 10 is short-circuited or insulated, light can be emitted without blocking the flow of current through the other light-emitting elements 1100 adjacent to the light-emitting element 1100.

Figure 8A:
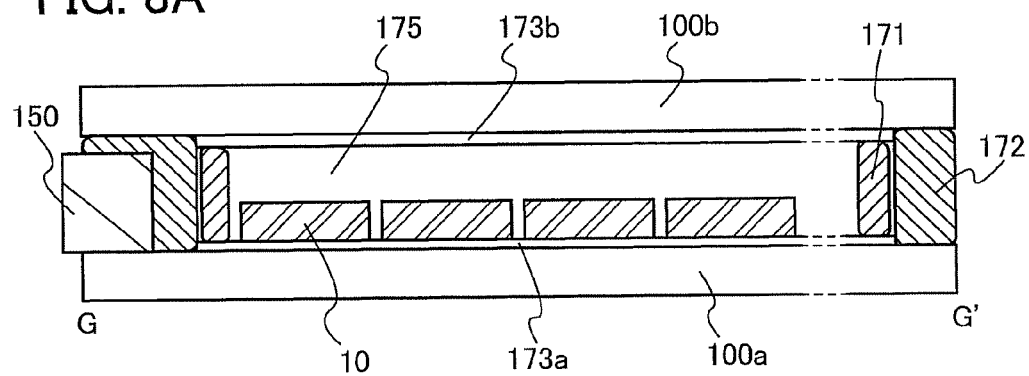
FIGS. 8A and 8B are diagrams each illustrating a structure of a light-emitting device.
Figure 8B:
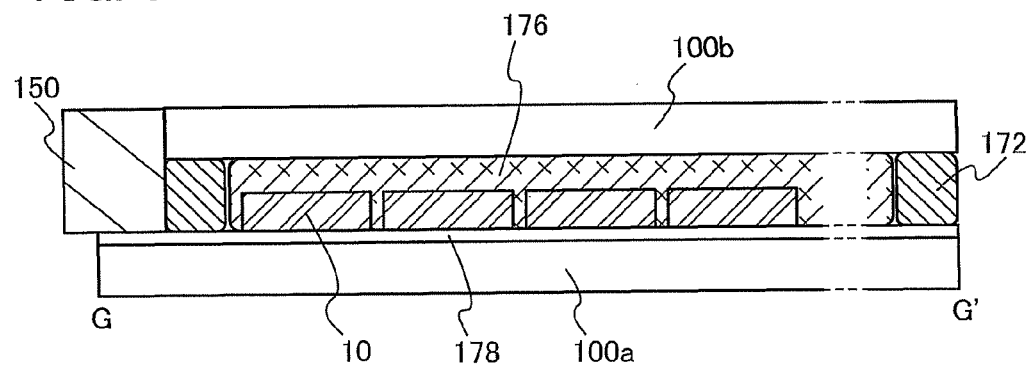

FIGS. 8A and 8B each illustrate a cross-sectional view along a line G-G' in FIG. 7A.

An example of a light-emitting device using an organic resin substrate as a substrate will be described with reference to FIG. 8A. In the light-emitting device illustrated in FIG. 8A, a first glass layer 173a is formed over the first substrate 100a, and the plurality of light-emitting units 10 are provided over the first glass layer 173a. In FIG. 8A, the first glass layer 173a and a second glass layer 173b are bonded to each other with a sealant 171. In the light-emitting device illustrated in FIG. 8A, the light-emitting unit 10 is provided in a space 175 surrounded by the first glass layer 173a, the second glass layer 173b, and the sealant 171. The first substrate 100a and a second substrate 100b are bonded to each other with a sealant 172.

A space may be provided between the sealant 171 and the sealant 172. Alternatively, the sealant 171 and the sealant 172 may be in contact with each other.

When the EL layer which forms the light-emitting unit 10 and the conductive layer which becomes the upper electrode are formed, using a metal mask which does not cover a region where the light-emitting unit 10 is formed and covers a region where the sealant 171 and the sealant 172 are formed, the light-emitting unit 10 may have a structure in which the EL layer and the conductive layer are not formed in the region where the sealant 171 and the sealant 172 are formed.

In the light-emitting device, the first substrate 100a and the second substrate 100b are preferably formed of the same organic resin material. When the same material is used for forming the first substrate 100a and the second substrate 100b, the occurrence of defective shape due to heat distortion or physical impact can be prevented. Therefore, the occurrence of deformation or breakage of the lighting device can be prevented at the time of manufacturing or using the light-emitting device.

An organic resin substrate and a glass layer are used in the light-emitting device of one embodiment of the present invention. For this reason, the light-emitting device can be reduced in weight. Moreover, the entry of moisture, an impurity, or the like from the outside of the light-emitting device to an organic compound or a metal material included in the light-emitting unit 10 can be prevented.

An example of a light-emitting device using a metal substrate as a first substrate 100a and using a glass substrate as a second substrate 100b will be described with reference to FIG. 8B. In the light-emitting device illustrated in FIG. 8B, the plurality of light-emitting units 10 are provided over the first substrate 100a with an insulating film 178 interposed therebetween. In FIG. 8B, the first substrate 100a and the second substrate 100b are bonded to each other with the sealant 172.

There is no particular limitation on a material of a metal substrate used as the first substrate 100a, but it is preferable to use a metal such as aluminum, copper, or nickel, a metal alloy such as an aluminum alloy or stainless steel, or the like. There is no particular limitation on the thickness of the metal substrate. For example, a metal substrate with a thickness greater than or equal to 10 μm and less than or equal to 200 μm is preferably used, in which case the light-emitting device can be reduced in weight.

As the first substrate 100a, a glass substrate, a quartz substrate, or the like can be used other than the metal substrate.

As illustrated in FIG. 8A, the converter 150 can be provided between the upper substrate and the lower substrate. Further, when the second substrate 100b is smaller than the first substrate 100a as illustrated in FIG. 8B, a thick converter can be provided without changing the thickness of the light-emitting device.

An inert gas (such as nitrogen or argon) fills the space 175 (FIG. 8A). A dry agent may be introduced into a region where the dry agent does not disturb light emission from the light-emitting unit 10 in the space 175. For example, a substance which absorbs moisture by chemical adsorption, such as an oxide of an alkaline earth metal (e.g., calcium oxide or barium oxide), can be used. Other than the above, a substance which adsorbs moisture by physical adsorption, such as zeolite or silica gel, may be used as the dry agent.

The space 175 can be filled with the filler 176 having a light-transmitting property (FIG. 8B). It is desirable that the filler 176 transmits as little moisture or oxygen as possible. In addition, the filler 176 containing a dry agent can be used.

A protective film may be formed between the filler 176 and the light-emitting unit 10. When the protective film is provided, moisture can be prevented from entering the EL layer from the filler 176; thus, a reduction in the lifetime of the light-emitting unit 10 can be suppressed. As the protective film, for example, a silicon nitride film, a silicon nitride oxide film, an aluminum oxide film, an aluminum nitride film, or the like can be used.

A known material can be used as the sealant 171. For example, a thermosetting material or a UV curable material may be used. A material capable of bonding glass is used for the sealant 171, and a material capable of bonding organic resins is used for the sealant 172. It is desirable that these materials transmit as little moisture or oxygen as possible. In addition, a sealant containing a dry agent can be used.

This embodiment can be freely combined with other embodiments.

(Embodiment 4)

Figure 9A:
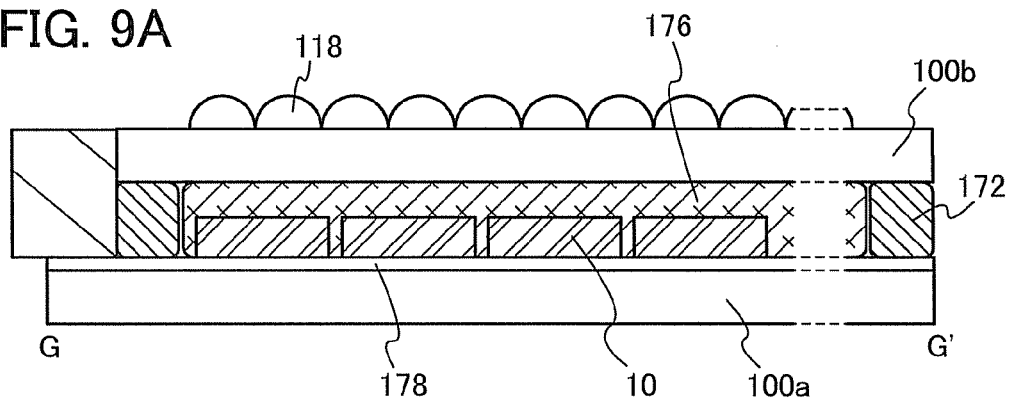
FIGS. 9A to 9C are diagrams each illustrating a structure of a light-emitting device.
Figure 9B:
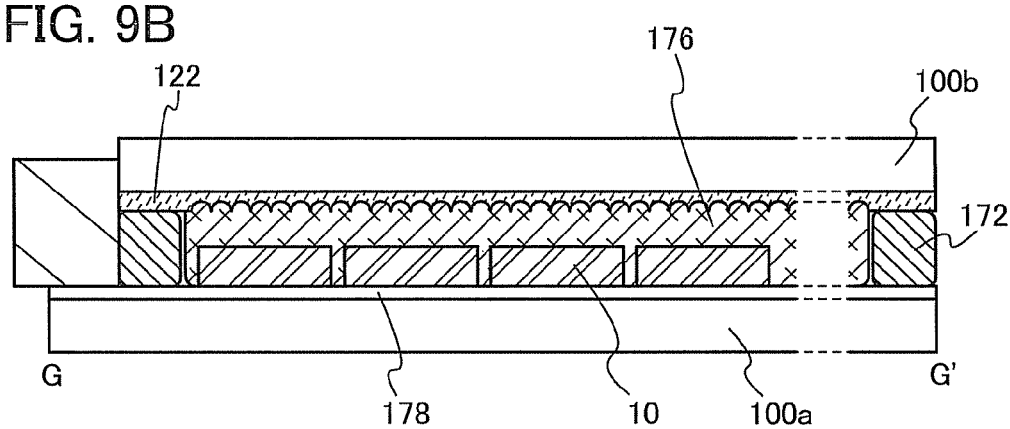
Figure 9C:
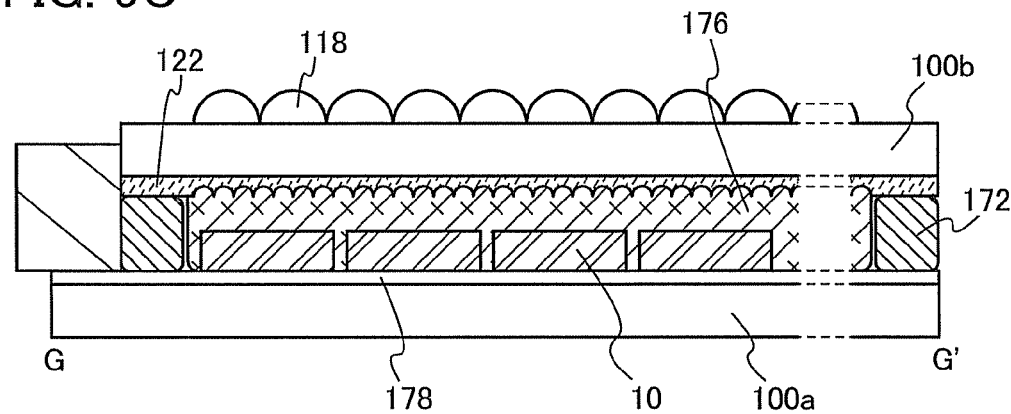

In this embodiment, structures of a light-emitting device including any of the light-emitting units 10 described as examples in the above embodiments in which the light extraction efficiency is increased will be described with reference to FIGS. 9A to 9C. FIGS. 9A to 9C shows examples of the light-emitting devices described in FIG. 8B in which the light extraction efficiency is increased.

Generally, in a light-emitting device including an organic EL element, there is a condition under which total reflection occurs inside the light-emitting device or at the boundary between the light-emitting device and the air when light is extracted to the outside of the light-emitting device (to the air), which causes a problem of a light extraction efficiency of the light emitting unit 10 lower than 100%. It is generally said that the light extraction efficiency of the light-emitting unit 10 is approximately 20% to 30%.

Specifically, when light enters a medium B having a low refractive index from a medium A having a high refractive index, total reflection occurs in some cases depending on the incidence angle.

At this time, it is preferable that an uneven structure be provided at the interface between the medium A and the medium B. Such a structure can suppress a phenomenon in which total reflection of light which enters the medium B from the medium A at an incident angle exceeding a critical angle occurs, which causes a reduction in the light extraction efficiency.

The light extraction efficiency of a light-emitting device of one embodiment of the present invention described below can be approximately 1.2 times to 2 times higher than the light extraction efficiency of a light-emitting device to which the present invention is not applied.

Modification Example 1

A modification example 1 can apply the same structure as the structure described in Embodiment 3 except for an uneven structure body 118 provided on a surface of the substrate 100b on the side in contact with the air.

The refractive index of the substrate 100b is higher than the refractive index of the air; thus, total reflection occurs at the boundary between the substrate 100b and the air in some cases. In Modification Example 1, the structure body 118 is provided at the boundary between the air and the substrate 100b, which makes it possible to reduce light which cannot be extracted to the air due to the total reflection, so that the light extraction efficiency of the light-emitting unit 10 can be increased.

The structure body 118 in a matrix is preferable although the structure body 118 in a striped form is effective. There is no particular limitation on the pattern of the unevenness; for example, a shape with a vertex such as a circular cone, a pyramid (e.g., a triangular pyramid or a square pyramid), or an umbrella shape, or a hemisphere can be used.

It is preferable that the size and height of the unevenness be approximately greater than or equal to 0.1 μm and less than or equal to 1000 μm. In particular, the unevenness preferably has a size or height greater than or equal to 1 μm, in which case the influence of interference of light can be reduced.

A pattern of unevenness is preferably provided so that gaps are not formed between adjacent portions of the unevenness. For example, it is preferable that in the pattern, the unevenness is provided in a closest-packed manner. In the pattern, the unevenness may be formed over part of or an entire air-contact surface of the substrate. It is preferable that the unevenness be formed at least in a light-emitting region.

The structure body 118 can be formed in such a manner that a hemispherical lens, a micro lens array, a film provided with an uneven structure body 118, a light diffusing film, or the like is bonded to the surface of the substrate 100b with a known adhesive or the like.

Alternatively, an uneven structure may be formed directly on the substrate 100b. As a method for Miming an uneven structure directly on the substrate, for example, an etching method, a sand blasting method, a microblast processing method, a droplet discharge method, a printing method (screen printing or offset printing by which a pattern is formed), a coating method such as a spin coating method, a dipping method, a dispenser method, a nanoimprint method, or the like can be employed as appropriate.

In one embodiment of the present invention, the structure body 118 is provided on the surface which is in contact with the air, whereby light which cannot be extracted to the air due to total reflection can be reduced, which results in an increase in the light extraction efficiency of the light-emitting device.

Modification Example 2

Light-emitting devices having a different structure from the structure of FIG. 9A will be described with reference to FIGS. 9B and 9C.

In FIG. 8B described in Embodiment 3, the space 175 is filled with the filler 176 having a light-transmitting property (see FIGS. 8A and 8B). For that reason, when light emitted from the light-emitting unit 10 enters the substrate 100b through the filler 176, the light is totally reflected in some cases. Thus, it is preferable that an uneven structure body be provided at a boundary with a condition under which the total reflection occurs.

The light-emitting unit 10 described in Modification Example 2 (FIG. 9B) includes the structure body 122 having the uneven shape on the light-emitting unit 10 side in the substrate 100b. Except for these, the light-emitting unit has the same structure as the structure described in Embodiment 3.

In Modification Example 2, the structure body 122 is provided between the substrate 100b and the filler 176. Therefore, such a structure can suppress a phenomenon in which total reflection of light which enters at an incident angle exceeding a critical angle occurs and the light extraction efficiency is reduced.

Note that FIG. 9C illustrates an example of a structure in which the structure body 122 and the structure body 118 described in the above embodiment are combined. By providing both the structure body 118 and the structure body 122, the light extraction efficiency can be increased further.

The structure body 122 can be formed in a manner similar to the manner of forming the structure body 118. It is preferable that the size and height of the unevenness be approximately greater than or equal to 0.1 μm and less than or equal to 1000 μm. In particular, the unevenness preferably has a size or height greater than or equal to 1 μm, in which case the influence of interference of light can be reduced.

When the pattern of the unevenness is periodic depending on the size of the unevenness, the unevenness functions as a diffraction grating, so that an interference effect is increased and light with a certain wavelength is easily extracted to the air. For that reason, it is preferable that the pattern of the unevenness be not periodic. Further, the pattern is formed at least in a light-emitting region.

In this embodiment, the uneven structure body is provided, whereby total reflection of light which enters at an incident angle exceeding a critical angle and a reduction in the light extraction efficiency due to the propagation of the light inside the light-emitting unit 10 can be suppressed.

This embodiment can be freely combined with other embodiments.

(Embodiment 5)

In this embodiment, an example of an EL layer which can be applied to one embodiment of the present invention will be described with reference to FIGS. 10A to 10C.

As illustrated in FIG. 10A, the EL layer 102 is provided between the lower electrode 103 and the upper electrode 108. The lower electrode 103 and the upper electrode 108 can have structures similar to those in Embodiment 1.

In this embodiment, in the EL layer 102, an electron-injection layer 705, an electron-transport layer 704, a layer 703 containing a light-emitting organic compound, a hole-transport layer 702, and a hole-injection layer 701 are stacked in this order from the lower electrode 103 side.

A manufacturing method of the light-emitting element illustrated in FIG. 10A will be described.

The hole-injection layer 701 is a layer containing a substance having a high hole-injection property. As the substance having a high hole-injection property, for example, metal oxides such as molybdenum oxide, titanium oxide, vanadium oxide, rhenium oxide, ruthenium oxide, chromium oxide, zirconium oxide, hafnium oxide, tantalum oxide, silver oxide, tungsten oxide, and manganese oxide can be used. A phthalocyanine-based compound such as phthalocyanine (abbreviation: H$_2$Pc), or copper(II) phthalocyanine (abbreviation: CuPc) can also be used.

Alternatively, the following aromatic amine compounds which are low molecular organic compounds can be used: 4,4',4''-tris(N,N-diphenylamino)triphenylamine (abbreviation: TDATA), 4,4',4''-tris[N-(3-methylphenyl)-N-phenylamino]triphenylamine (abbreviation: MTDATA), 4,4'-bis[N-(4-diphenylaminophenyl)-N-phenylamino]biphenyl (abbreviation: DPAB), 4,4'-bis(N-{4-[N'-(3-methylphenyl)-N'-phenylamino]phenyl}-N-phenylamino)biphenyl (abbreviation: DNTPD), 1,3,5-tris[N-(4-diphenylaminophenyl)-N-phenylamino]benzene (abbreviation: DPA3B), 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3-[N-(1-naphthyl)-N-(9-phenylcarbazol-3-yl)amino]-9-phenylcarbazole (abbreviation: PCzPCN1), or the like.

Further alternatively, any of high molecular compounds (e.g., oligomers, dendrimers, or polymers) can be used. For example, the following high molecular compounds can be used: poly(N-vinylcarbazole) (abbreviation: PVK), poly(4-vinyl triphenylamine) (abbreviation: PVTPA), poly[N-(4-{N'-[4-(4-diphenylamino)phenyl]phenyl-N-phenylamino}phenyl)methacrylamide] (abbreviation: PTPDMA), and poly[N,N'-bis(4-butylphenyl)-N,N'-bis(phenyl)benzidine] (abbreviation: Poly-TPD). A high molecular compound to which acid is added, such as poly(3,4-ethylenedioxythiophene)/poly(styrenesulfonic acid) (PEDOT/PSS) or polyaniline/poly(styrenesulfonic acid) (PAni/PSS), can also be used.

In particular, for the hole-injection layer 701, a composite material in which an acceptor substance is mixed with an organic compound having a high hole-transport property is preferably used. With the use of the composite material in which an acceptor substance is mixed with a substance having a high hole-transport property, excellent hole-injection property from the upper electrode 108 can be obtained, which results in a reduction in the driving voltage of the light-emitting element. Such a composite material can be formed by co-evaporation of a substance having a high hole-transport property and a substance having an acceptor property. When the hole-injection layer 701 is formed using the composite material, holes are easily injected from the upper electrode 108 into the EL layer 102.

As the organic compound for the composite material, various compounds such as an aromatic amine compound, carbazole derivatives, aromatic hydrocarbon, and a high molecular compound (such as oligomers, dendrimers, or polymers) can be used. The organic compound used for the composite material is preferably an organic compound having a high hole-transport property. Specifically, a substance having a hole mobility of $10^{-6}$ cm$^2$/Vs or higher is preferably used. It is to be noted that a substance other than the above may be used as long as it has a higher hole-transport property than an electron-transport property. The organic compounds which can be used for the composite material will be specifically shown below.

Examples of the organic compounds that can be used for the composite material include: aromatic amine compounds such as TDATA, MTDATA, DPAB, DNTPD, DPA3B, PCzPCA1, PCzPCA2, PCzPCN1, 4,4'-bis[N-(1-naphthyl)-N-phenylamino]biphenyl (abbreviation: NPB or α-NPD), N,N'-bis(3-methylphenyl)-N,N'-diphenyl-[1,1'-biphenyl]-4,4'-diamine (abbreviation: TPD), and 4-phenyl-4'-(9-phenylfluoren-9-yl)triphenylamine (abbreviation: BPAFLP); and carbazole derivatives such as 4,4'-di(N-carbazolyl)biphenyl (abbreviation: CBP), 1,3,5-tris[4-(N-carbazolyl)phenyl]benzene (abbreviation: TCPB), 9-[4-(10-phenyl-9-anthryl)phenyl]-9H-carbazole (abbreviation: CzPA), 9-phenyl-3-[4-(10-phenyl-9-anthryl)phenyl]-9H-carbazole (abbreviation: PCzPA), and 1,4-bis[4-(N-carbazolyl)phenyl]-2,3,5,6-tetraphenylbenzene.

Further, it is possible to use the following aromatic hydrocarbon compounds: 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 9,10-bis[2-(1-naphthyl)phenyl]-2-tert-butylanthracene, 9,10-bis[2-(1-naphthyl)phenyl]anthracene, 2,3,6,7-tetramethyl-9,10-di(1-naphthyl)anthracene, or the like.

Furthermore, an aromatic hydrocarbon compound such as 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, 2,5,8,11-tetra(tert-butyl)perylene, pentacene, coronene, 4,4'-bis(2,2-diphenylvinyl)biphenyl (abbreviation: DPVBi), or 9,10-bis[4-(2,2-diphenylvinyl)phenyl]anthracene (abbreviation: DPVPA) can be used.

As the acceptor substance, organic compounds such as 7,7,8,8-tetracyano-2,3,5,6-tetrafluoroquinodimethane (abbreviation: F$_4$-TCNQ) and chloranil; and transition metal oxides can be given. In addition, oxides of metals belonging to Groups 4 to 8 in the periodic table can be also given. Specifically, vanadium oxide, niobium oxide, tantalum oxide, chromium oxide, molybdenum oxide, tungsten oxide, manganese oxide, and rhenium oxide are preferable since their electron-accepting property is high. Among these, molybdenum oxide is especially preferable since it is stable in the air and its hygroscopic property is low and is easily treated. In addition, use of molybdenum trioxide is preferable.

A metal oxide or the composite material in which a metal oxide is mixed with an organic compound having a high hole-transport property can be used as a wiring material or an electrode material. For example, the metal oxide and the composite material can be used as a wiring, an upper electrode, or a lower electrode disclosed in these embodiments. Alternatively, a stacked layer of the composite material and a metal material and/or a light-transmitting conductive material can be used as a wiring material or an electrode material. In addition, a halogen element is added to the metal oxide or the above-described composite material in which a metal oxide is mixed with an organic compound having a high hole-transport property, whereby the resistivity of the metal oxide or the composite material can be reduced. The halogen element which is to be added is preferably fluorine. Further, plural kinds of halogen elements may be added.

By using a material with low resistivity for the hole-injection layer 701, an increase in driving voltage can be reduced. Even in the case where the area of the light-emitting element is large, luminance variation in a light-emitting surface caused by a voltage drop is hardly generated, so that a bright light-emitting element with high uniformity of luminance in a light-emitting surface can be achieved.

For example, although the resistivity of the composite material containing NPB and molybdenum trioxide (a film formed by a co-evaporation method so that the weight ratio is 4:1=NPB:molybdenum trioxide) is $1.8 \times 10^9$ Ω·cm, when addition of fluorine is performed at a concentration of $1 \times 10^{21}$ atoms/cm$^3$, the resistivity of the composite material can be $3.5 \times 10^5$ Ω·cm.

The hole-transport layer 702 is a layer containing a substance having a high hole-transport property. As the substance having a high hole-transport property, any of the following aromatic amine compounds can be used, for example: NPB, TPD, BPAFLP, 4,4'-bis[N-(9,9-dimethylfluoren-2-yl)-N-phenylamino]biphenyl (abbreviation: DFLDPBi), and 4,4'-bis[N-(spiro-9,9'-bifluoren-2-yl)-N-phenylamino]biphenyl (abbreviation: BSPB). The substances mentioned here are mainly ones that have a hole mobility of $10^{-6}$ cm$^2$/V·s or higher. The layer containing a substance having a high hole-transport property is not limited to a single layer, and may be a stack of two or more layers containing any of the above substances.

For the hole-transport layer 702, a carbazole derivative such as CBP, CzPA, or PCzPA or an anthracene derivative such as t-BuDNA, DNA, or DPAnth may be used.

For the hole-transport layer 702, a high molecular compound such as PVK, PVTPA, PTPDMA, or Poly-TPD can be used.

For the layer 703 containing a light-emitting organic compound, a fluorescent compound which exhibits fluorescence or a phosphorescent compound which exhibits phosphorescence can be used.

Examples of the fluorescent materials that emit blue light include N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(10-phenyl-9-anthryl)-4'-(9-phenyl-9H-carbazol-3-yl)triphenylamine (abbreviation: PCBAPA), and the like. In addition, examples of the materials that emit green light include N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), N-[9,10-bis(1,1'-biphenyl-2-yl)]-N-[4-(9H-carbazol-9-yl)phenyl]-N-phenylanthracen-2-amine (abbreviation: 2YGABPhA), N,N,9-triphenylanthracen-9-amine (abbreviation: DPhAPhA), and the like. Further, examples of the materials that emit yellow light include rubrene, 5,12-bis(1,1'-biphenyl-4-yl)-6,11-diphenyltetracene (abbreviation: BPT), and the like. Furthermore, examples of materials for red light emission include N,N,N',N'-tetrakis(4-methylphenyl)tetracene-5,11-diamine (abbreviation: p-mPhTD), 7,14-diphenyl-N,N,N',N'-tetrakis(4-methylphenyl)acenaphtho[1,2-a]fluoranthene-3,10-diamine (abbreviation: p-mPhAFD), and the like.

The phosphorescent compounds that can be used for the layer 703 containing a light-emitting organic compound will be given. Examples of the materials that emit blue light include bis[2-(4',6'-difluorophenyl)pyridinato-N,C$^{2'}$]iridium(III)tetrakis(1-pyrazolyl)borate (abbreviation: FIr6), bis[2-(4',6'-difluorophenyl)pyridinato-N,C$^{2'}$]iridium(III)picolinate (abbreviation: FIrpic), bis{2-[3',5'-bis(trifluoromethyl)phenyl]pyridinato-N,C$^{2'}$}iridium(III) picolinate (abbreviation: Ir(CF$_3$ppy)$_2$(pic)), bis[2-(4',6'-difluorophenyl)pyridinato-N,C$^{2'}$]iridium(III)acetylacetonate (abbreviation: FIr(acac)), and the like. Examples of the materials that emit green light include tris(2-phenylpyridinato-N,C$^{2'}$)iridium(III) (abbreviation: Ir(ppy)$_3$), bis(2-phenylpyridinato-N,C$^{2'}$)iridium(III) acetylacetonate (abbreviation: Ir(ppy)$_2$(acac)), bis(1,2-diphenyl-1H-benzimidazolato)iridium(III)acetylacetonate (abbreviation: Ir(pbi)$_2$(acac)), bis(benzo[h]quinolinato)iridium(III)acetylacetonate (abbreviation: Ir(bzq)$_2$(acac)), tris(benzo[h]quinolinato)iridium(III) (abbreviation: Ir(bzq)$_3$), and the like. Examples of the materials that emit yellow light include bis(2,4-diphenyl-1,3-oxazolato-N,C$^{2'}$)iridium(III) acetylacetonate (abbreviation: Ir(dpo)$_2$(acac)), bis[2-(4'-(perfluorophenylphenyl)pyridinato]iridium(III)acetylacetonate (abbreviation: Ir(p-PF-ph)$_2$(acac)), bis(2-phenylbenzothiazolato-N,C$^{2'}$)iridium(III)acetylacetonate (abbreviation: Ir(bt)$_2$(acac)), (acetylacetonato)bis[2,3-bis(4-fluorophenyl)-5-methylpyrazinato]iridium(III) (abbreviation: Ir(Fdppr-Me)$_2$(acac)), (acetylacetonato)bis{2-(4-methoxyphenyl)-3,5-dimethylpyrazinato}iridium(III) (abbreviation: Ir(dmmoppr)$_2$(acac)), and the like. Examples of the materials that emit orange light include tris(2-phenylquinolinato-N,C$^{2'}$)iridium(III) (abbreviation: Ir(pq)$_3$), bis(2-phenylquinolinato-N,C$^{2'}$)iridium(III)acetylacetonate (abbreviation: Ir(pq)$_2$(acac)), (acetylacetonato)bis(3,5-dimethyl-2-phenylpyrazinato)iridium(III) (abbreviation: Ir(mppr-Me)$_2$(acac)), (acetylacetonato)bis(5-isopropyl-3-methyl-2-phenylpyrazinato)iridium(III) (abbreviation: Ir(mppr-iPr)$_2$(acac)), and the like. Examples of the materials that emit red light include the following organometallic complexes: bis[2-(2'-benzo[4,5-α]thienyl)pyridinato-N,C$^{3'}$]iridium(III)acetylacetonate (abbreviation: Ir(btp)$_2$(acac)), bis(1-phenylisoquinolinato-N,C$^{2'}$)iridium(III)acetylacetonate (abbreviation: Ir(piq)$_2$(acac)), (acetylacetonato)bis[2,3-bis(4-fluorophenyl)quinoxalinato]iridium(III) (abbreviation: Ir(Fdpq)$_2$(acac)), (acetylacetonato)bis(2,3,5-triphenylpyrazinato)iridium(III) (abbreviation: Ir(tppr)$_2$(acac)), (dipivaloylmethanato)bis(2,3,5-triphenylpyrazinato)iridium(III) (abbreviation: Ir(tppr)$_2$(dpm)), (2,3,7,8,12,13,17,18-octaethyl-21H,23H-porphyrin)platinum(II) (abbreviation: PtOEP), and the like. In addition, a rare earth metal complex such as tris(acetylacetonato)(monophenanthroline)terbium(III) (abbreviation: Tb(acac)$_3$(Phen)), tris(1,3-diphenyl-1,3-propanedionato)(monophenanthroline)europium(III) (abbreviation: Eu(DBM)$_3$(Phen)), or tris[1-(2-thenoyl)-3,3,3-trifluoroacetonato](monophenanthroline)europium(III) (abbreviation: Eu(TTA)$_3$(Phen)) exhibits light, emission from a rare earth metal ion (electron transition between different multiplicities); therefore, such a rare earth metal complex can be used as a phosphorescent compound.

Note that the layer 703 containing a light-emitting organic compound may have a structure in which the above light-emitting organic compound (a guest material) is dispersed in another substance (a host material). As a host material, various kinds of materials can be used, and it is preferable to use a substance which has a lowest unoccupied molecular orbital level (LUMO level) higher than the light-emitting substance and has a highest occupied molecular orbital level (HOMO level) lower than that of the light-emitting substance.

Specific examples of the host material are as follows: a metal complex such as tris(8-quinolinolato)aluminum(III) (abbreviation: Alq), tris(4-methyl-8-quinolinolato)aluminum(III) (abbreviation: Almq$_3$), bis(10-hydroxybenzo[h]quinolinato)beryllium(III) (abbreviation: BeBq$_2$), bis(2-methyl-8-quinolinolato) (4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), or bis[2-(2-benzothiazolyl)phenolato]zinc(II) (abbreviation: ZnBTZ); a heterocyclic compound such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), 2,2',2''-(1,3,5-benzenetriyl)tris(1-phenyl-1H-benzimidazole) (abbreviation: TPBI), bathophenanthroline (abbreviation: BPhen), or bathocuproine (abbreviation: BCP); a condensed aromatic compound such as 9-[4-(10-phenyl-9-anthryl)phenyl]-9H-carbazole (abbreviation: CzPA), 3,6-diphenyl-9-[4-(10-phenyl-9-anthryl)phenyl]-9H-carbazole (abbreviation: DPCzPA), 9,10-bis(3,5-diphenylphenyl)anthracene (abbreviation: DPPA), 9,10-di(2-naphthyl)anthracene (abbreviation: DNA), 2-tert-butyl-9,10-di(2-naphthyl)anthracene (abbreviation: t-BuDNA), 9,9'-bianthryl (abbreviation: BANT), 9,9'-(stilbene-3,3'-diyl)diphenanthrene (abbreviation: DPNS), 9,9'-(stilbene-4,4'-diyl)diphenanthrene (abbreviation: DPNS2), 3,3',3''-(benzene-1,3,5-triyl)tripyrene (abbreviation: TPB3), 9,10-diphenylanthracene (abbreviation: DPAnth), or 6,12-dimethoxy-5,11-diphenylchrysene; an aromatic amine compound such as N,N-dipheyl-9-[4-(10-phenyl-9-anthryl)phenyl]-9H-carbazol-3-amine (abbreviation: CzA1PA), 4-(10-phenyl-9-anthryl)triphenylamine (abbreviation: DPhPA), N,9-diphenyl-N-[4-(10-phenyl-9-anthryl)phenyl]-9H-carbazol-3-amine (abbreviation: PCAPA), N,9-diphenyl-N-{4-[4-(10-phenyl-9-anthryl)phenyl]phenyl}-9H-carbazol-3-amine (abbreviation: PCAPBA), N-(9,10-diphenyl-2-anthryl)-N,9-diphenyl-9H-carbazol-3-amine (abbreviation: 2PCAPA), NPB (or α-NPD), TPD, DFLDPBi, or BSPB; and the like.

Alternatively, as the host material, plural kinds of materials can be used. For example, in order to suppress crystallization, a substance such as rubrene which suppresses crystallization may be further added. In addition, NPB, Alq, or the like may be further added in order to transfer energy efficiently to the guest material.

When a structure in which a guest material is dispersed in a host material is employed, crystallization of the layer 703 containing a light-emitting organic compound can be suppressed. Further, concentration quenching due to high concentration of the guest material can be suppressed.

Further, by providing a plurality of layers each containing a light-emitting organic compound and making the emission colors of the layers different, light emission of a desired color can be obtained from the light-emitting element as a whole. For example, in a light-emitting element including two layers each containing a light-emitting organic compound, the emission color of a first layer containing a light-emitting organic compound and the emission color of a second layer containing a light-emitting organic compound are made complementary, so that the light-emitting element as a whole can emit white light. Note that the word "complementary" means color relationship in which an achromatic color is obtained when colors are mixed. That is, when complementary colored light emitted from substances is mixed, white light emission can be obtained. This can be applied to a light-emitting element including three or more layers each containing a light-emitting organic compound.

The electron-transport layer 704 is a layer containing a substance having a high electron-transport property. As the substance having a high electron-transport property, any of the following substances can be used, for example: a metal complex having a quinoline skeleton or a benzoquinoline skeleton such as tris(8-quinolinolato)aluminum (abbreviation: Alq), tris(4-methyl-8-quinolinolato)aluminum (abbreviation: Almq$_3$), bis(10-hydroxybenzo[h]-quinolinato)beryllium (abbreviation: BeBq$_2$), or bis(2-methyl-8-quinolinolato)(4-phenylphenolato)aluminum (abbreviation: BAlq). Alternatively, a metal complex or the like including an oxazole-based or thiazole-based ligand, such as bis[2-(2-hydroxyphenyl)benzoxazolato]zinc (abbreviation: Zn(BOX)$_2$) or bis[2-(2-hydroxyphenyl)benzothiazolato]zinc (abbreviation: Zn(BTZ)$_2$) can be used. Other than the metal complexes, 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), bathophenanthroline (abbreviation: BPhen), bathocuproine (abbreviation: BCP), or the like can also be used. The substances mentioned here are mainly ones that have an electron mobility of $10^{-6}$ cm$^2$/V·s or higher. The electron-transport layer is not limited to a single layer, and may be a stack of two or more layers containing any of the above substances.

The electron-injection layer 705 is a layer containing a substance having a high electron-injection property. For the electron-injection layer 705, an alkali metal, an alkaline earth metal, or a compound thereof, such as lithium, cesium, calcium, lithium fluoride, cesium fluoride, calcium fluoride, or lithium oxide, can be used. In addition, a rare earth metal compound such as erbium fluoride can also be used. Any of the above substances for forming the electron-transport layer 704 or substances in which an alkali metal or an alkaline earth metal compound is included in the substances for forming the electron-transport layer 704 can also be used.

Note that the hole-injection layer 701, the hole-transport layer 702, the layer 703 containing a light-emitting organic compound, the electron-transport layer 704, and the electron-injection layer 705 which are described above can each be formed by a method such as an evaporation method (e.g., a vacuum evaporation method), an ink-jet method, or a coating method.

Note that a plurality of EL layers may be stacked between the lower electrode 103 and the upper electrode 108 as illustrated in FIG. 10B. In that case, a charge generation layer 803 is preferably provided between a first EL layer 800 and a second EL layer 801 which are stacked. The charge generation layer 803 can be formed by using the above-described composite material. Further, the charge generation layer 803 may have a stacked structure including a layer containing the composite material and a layer containing another material. In that case, as the layer containing another material, a layer containing an electron donating substance and a substance having a high electron-transport property, a layer formed of a transparent conductive film, or the like can be used. As for a light-emitting element having such a structure, problems such as energy transfer and quenching occur with difficulty, and a light-emitting element which has both high light emission efficiency and long lifetime can be easily obtained due to expansion in the choice of materials. Moreover, a light-emitting element which provides phosphorescence from one of the EL layers and fluorescence from the other of the EL layers can be easily obtained. Note that this structure can be combined with the above-described structures of the EL layer.

Furthermore, by making emission colors of EL layers different, light of a desired color can be obtained from the light-emitting element as a whole. For example, the emission colors of first and second EL layers are complementary in a light-emitting element having the two stacked EL layers, so that the light-emitting element can be made to emit white light as a whole. Note that the word "complementary" means color relationship in which an achromatic color is obtained when colors are mixed. That is, when complementary colored light emitted from substances is mixed, white light emission can be obtained. Further, the same applies to a light-emitting element having three or more stacked EL layers.

As illustrated in FIG. 10C, the EL layer 102 may include, between the lower electrode 103 and the upper electrode 108, the hole-injection layer 701, the hole-transport layer 702, the layer 703 containing a light-emitting organic compound, the electron-transport layer 704, an electron-injection buffer layer 706, an electron-relay layer 707, and a composite material layer 708 which is in contact with the lower electrode 103.

The composite material layer 708 can be formed using the above-described composite material in which an acceptor substance is mixed with an organic compound having a high hole-transport property.

Further, by providing the electron-injection buffer layer 706, an injection barrier between the composite material layer 708 and the electron-transport layer 704 can be reduced; thus, electrons generated in the composite material layer 708 can be easily injected to the electron-transport layer 704.

For the electron-injection buffer layer 706, a substance having a high electron-injection property, such as an alkali metal, an alkaline earth metal, a rare earth metal, a compound of the above metal (e.g., an alkali metal compound (e.g., an oxide such as lithium oxide, a halide, and a carbonate such as lithium carbonate or cesium carbonate), an alkaline earth metal compound (e.g., an oxide, a halide, and a carbonate), or a rare earth metal compound (e.g., an oxide, a halide, and a carbonate) can be used.

Further, in the case where the electron-injection buffer layer 706 contains a substance having a high electron-transport property and a donor substance, the donor substance is preferably added so that the mass ratio of the donor substance to the substance having a high electron-transport property is from 0.001:1 to 0.1:1. Examples of the donor substance include an organic compound such as tetrathianaphthacene (abbreviation: TTN), nickelocene, and decamethylnickelocene, in addition to an alkali metal, an alkaline earth metal, a rare earth metal, a compound of the above metal (e.g., an alkali metal compound (e.g., an oxide such as lithium oxide, a halide, and a carbonate such as lithium carbonate or cesium carbonate), an alkaline earth metal compound (e.g., an oxide, a halide, and carbonate), and a rare earth metal compound (e.g., an oxide, a halide, and carbonate)). Note that as the substance having a high electron-transport property, a material similar to the material for the electron-transport layer 704 described above can be used.

Furthermore, the electron-relay layer 707 is preferably formed between the electron-injection buffer layer 706 and the composite material layer 708. The electron-relay layer 707 is not necessarily provided; however, by providing the electron-relay layer 707 having a high electron-transport property, electrons can be rapidly transported to the electron-injection buffer layer 706.

The structure in which the electron-relay layer 707 is sandwiched between the composite material layer 708 and the electron-injection buffer layer 706 is a structure in which the acceptor substance contained in the composite material layer 708 and the donor substance contained in the electron-injection buffer layer 706 are less likely to interact with each other, and thus their functions hardly interfere with each other. Therefore, an increase in driving voltage can be prevented.

The electron-relay layer 707 contains a substance having a high electron-transport property and is formed so that the LUMO level of the substance having a high electron-transport property is located between the LUMO level of the acceptor substance contained in the composite material layer 708 and the LUMO level of the substance having a high electron-transport property contained in the electron-transport layer 704. In the case where the electron-relay layer 707 contains a donor substance, the donor level of the donor substance is controlled so as to be located between the LUMO level of the acceptor substance contained in the composite material layer 708 and the LUMO level of the substance having a high electron-transport property contained in the electron-transport layer 704. As a specific value of the energy level, the LUMO level of the substance having a high electron-transport property contained in the electron-relay layer 707 is preferably greater than or equal to −5.0 eV, more preferably greater than or equal to −5.0 eV and less than or equal to −3.0 eV.

As the substance having a high electron-transport property contained in the electron-relay layer 707, a phthalocyanine-based material or a metal complex having a metal-oxygen bond and an aromatic ligand is preferably used.

As the phthalocyanine-based material contained in the electron-relay layer 707, in particular, any of the followings structural formula is preferably used: CuPc, phthalocyanine tin(II) complex (SnPc), phthalocyanine zinc complex (ZnPc), cobalt(II) phthalocyanine, β-form (CoPc), phthalocyanine iron (FePc), and vanadyl 2,9,16,23-tetraphenoxy-29H,31H-phthalocyanine (PhO-VOPc).

As the metal complex which has a metal-oxygen bond and an aromatic ligand and is contained in the electron-relay layer 707, a metal complex having a metal-oxygen double bond is preferably used. The metal-oxygen double bond has an acceptor property (a property of easily accepting electrons); thus, electrons can be transferred (donated and accepted) more easily. Further, the metal complex having a metal-oxygen double bond is considered stable. Thus, the use of the metal complex having the metal-oxygen double bond makes it possible to drive the light-emitting element at low voltage more stably.

As a metal complex having a metal-oxygen bond and an aromatic ligand, a phthalocyanine-based material is preferable. Specifically, any of vanadyl phthalocyanine (VOPc), a phthalocyanine tin(IV) oxide complex (SnOPc), and a phthalocyanine titanium oxide complex (TiOPc) is preferable because a metal-oxygen double bond is more likely to act on another molecule in terms of a molecular structure and an acceptor property is high.

Note that as the phthalocyanine-based materials described above, a phthalocyanine-based material having a phenoxy group is preferable. Specifically, a phthalocyanine derivative having a phenoxy group, such as PhO-VOPc, is preferable. A phthalocyanine derivative having a phenoxy group is soluble in a solvent. Thus, a phthalocyanine derivative has an advantage of being easily handled during formation of the light-emitting element and an advantage of facilitating maintenance of an apparatus used for forming a film.

The electron-relay layer 707 may further contain a donor substance. Examples of the donor substance include an organic compound such as tetrathianaphthacene (abbreviation: TTN), nickelocene, and decamethylnickelocene, in addition to an alkali metal, an alkaline earth metal, a rare earth metal, and a compound of the above metals (e.g., an alkali metal compound (including an oxide such as lithium oxide, a halide, and a carbonate such as lithium carbonate or cesium carbonate), an alkaline earth metal compound (including an oxide, a halide, and a carbonate), and a rare earth metal compound (including an oxide, a halide, and a carbonate)). When such a donor substance is contained in the electron-relay layer 707, electrons can be transferred easily and the light-emitting element can be driven at lower voltage.

In the case where a donor substance is contained in the electron-relay layer 707, in addition to the materials described above as the substance having a high electron-transport property, a substance having a LUMO level greater than the acceptor level of the acceptor substance contained in the composite material layer 708 can be used. As a specific energy level, a LUMO level is greater than or equal to −5.0 eV, preferably greater than or equal to −5.0 eV and less than or equal to −3.0 eV. As examples of such a substance, a perylene derivative and a nitrogen-containing condensed aromatic compound are given. Note that a nitrogen-containing condensed aromatic compound is preferably used for the electron-relay layer 707 because of its stability.

As specific examples of the perylene derivative, the following are given: 3,4,9,10-perylenetetracarboxylicdianhydride (abbreviation: PTCDA), 3,4,9,10-perylenetetracarboxylic-bis-benzimidazole (abbreviation: PTCBI), N,N'-dioctyl-3,4,9,10-perylenetetracarboxylic diimide (abbreviation: PTCDI-C8H), N,N'-dihexyl-3,4,9,10-perylenetetracarboxylic diimide (Hex PTC), and the like.

As specific examples of the nitrogen-containing condensed aromatic compound, the following are given: pirazino[2,3-f][1,10]phenanthroline-2,3-dicarbonitrile (abbreviation: PPDN), 2,3,6,7,10,11-hexacyano-1,4,5,8,9,12-hexaazatriphenylene (abbreviation: $HAT(CN)_6$), 2,3-diphenylpyrido[2,3-b]pyrazine (abbreviation: 2PYPR), 2,3-bis(4-fluorophenyl)pyrido[2,3-b]pyrazine (abbreviation: F2PYPR), and the like.

Other than the above, 7,7,8,8-tetracyanoquinodimethane (abbreviation: TCNQ), 1,4,5,8-naphthalenetetracarboxylic-dianhydride (abbreviation: NTCDA), perfluoropentacene, copper hexadecafluoro phthalocyanine (abbreviation: $F_{16}CuPc$), N,N'-bis(2,2,3,3,4,4,5,5,6,6,7,7,8,8,8-pentadecafluorooctyl)-1,4,5,8-naphthalenetetracarboxylic diimide (abbreviation: NTCDI-C8F), 3',4'-dibutyl-5,5''-bis(dicyanomethylene)-5,5''-dihydro-2,2':5',2''-terthiophene) (abbreviation: DCMT), methanofullerene (e.g., [6,6]-phenyl $C_{61}$ butyric acid methyl ester), or the like can be used.

Note that in the case where a donor substance is contained in the electron-relay layer 707, the electron-relay layer 707 may be formed by a method such as co-evaporation of the substance having a high electron-transport property and the donor substance.

The hole-injection layer 701, the hole-transport layer 702, the layer 703 containing a light-emitting organic compound, and the electron-transport layer 704 may each be formed using any of the above-described materials.

In the above manner, the EL layer 102 of this embodiment can be manufactured.

This embodiment can be freely combined with other embodiments.

(Embodiment 6)

In this embodiment, an example of a lighting device including the light-emitting unit of one embodiment of the present invention will be described with reference to FIGS. 11A and 11B.

In this embodiment, a lighting device whose light-emitting portion has a curved surface can be provided.

One embodiment of the present invention can be used for lighting in a car; for example, lighting can be provided for a dashboard, ceiling, or the like.

Figure 11A:
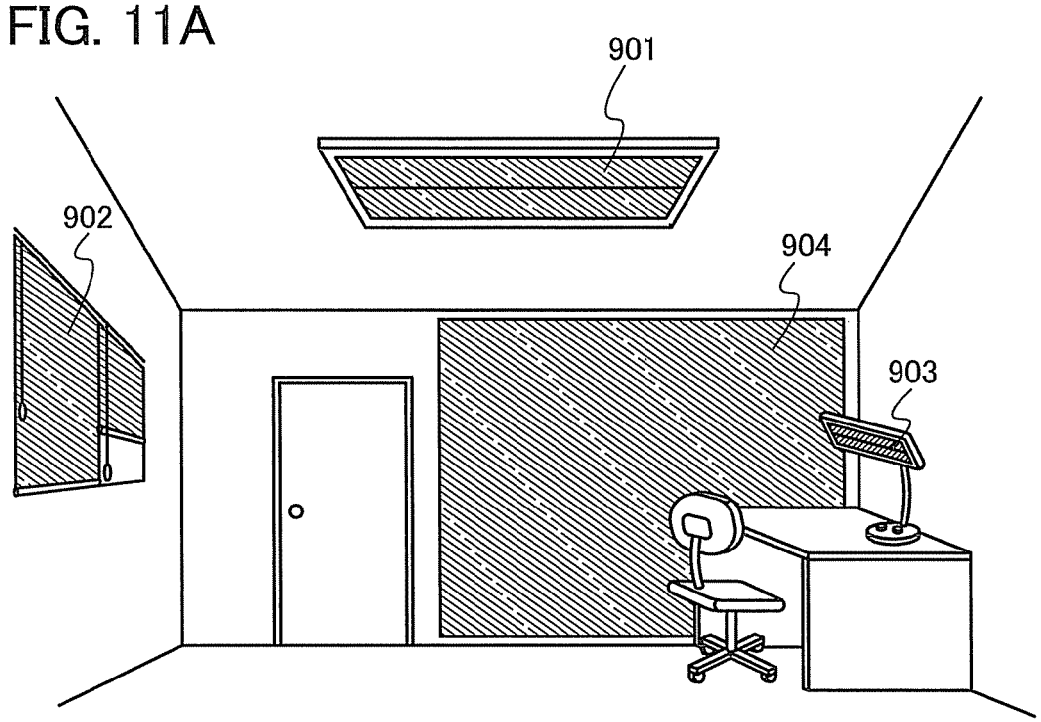
FIGS. 11A and 11B are diagrams illustrating lighting devices.

FIG. 11A illustrates an interior lighting device 901, a desk lamp 903, and a planar lighting device 904 to which one embodiment of the present invention is applied. The area of the light-emitting device can be increased, and therefore can be used as a large-area lighting device. Further, since the light-emitting device is thin, the light-emitting device can be mounted on a wall. Furthermore, the light-emitting device can be used as a roll-type lighting device 902.

Figure 11B:
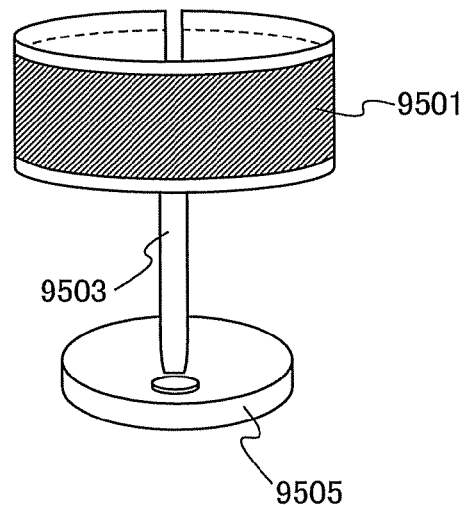

FIG. 11B illustrates another example of the lighting device. A desk lamp illustrated in FIG. 11B includes a lighting portion 9501, a support 9503, a support base 9505, and the like. The lighting portion 9501 includes the light-emitting unit of one embodiment of the present invention. As described above, in one embodiment of the present invention, a lighting device having a curved surface or a lighting device having a flexible lighting portion can be provided. The use of a flexible light-emitting unit for a lighting device as described above not only improves the degree of freedom in design of the lighting device but also enables the lighting device to be mounted onto a portion having a curved surface, such as the ceiling or a dashboard of a car.

This embodiment can be freely combined with other embodiments.

This application is based on Japanese Patent Application serial no. 2011-027975 filed with Japan Patent Office on Feb. 11, 2011, the entire contents of which are hereby incorporated by reference.

What is claimed is:

1. A light-emitting unit comprising:
    a first light-emitting element over an insulating surface; a second light-emitting element over the insulating surface; a separation layer; a first insulating layer; and a second insulating layer,
    the first light-emitting element comprising:
        a first electrode;
        a first light-emitting layer over the first electrode; and
        a second electrode over the first light-emitting layer,
    the second light-emitting element comprising:
        a third electrode;
        a second light-emitting layer over the third electrode; and
        a fourth electrode over the second light-emitting layer,
    wherein:
    the first insulating layer covers an edge portion of the first electrode,
    the second insulating layer is formed over the third electrode,
    the separation layer is formed over the third electrode and the second insulating layer,
    the second electrode is electrically connected to the third electrode, and
    the second electrode and the fourth electrode each comprise a composite material comprising an organic compound and a metal oxide.

2. The light-emitting unit according to claim 1,
    wherein the separation layer comprises a leg portion and a stage portion over the leg portion, and
    wherein a projected area of the stage portion to the third electrode is larger than that of the leg portion.

3. The light-emitting unit according to claim 2, wherein the second electrode is electrically connected to the third electrode in a region overlapping with the stage portion.

4. The light-emitting unit according to claim 2, wherein in a cross section of the separation layer, a space is provided on a leg portion side of a straight line connecting a point where the leg portion is in contact with the third electrode and an edge of the stage portion protruding beyond the leg portion.

5. The light-emitting unit according to claim 1, wherein the second electrode extends beyond the edge portion of the first electrode with the first insulating layer interposed therebetween.

6. The light-emitting unit according to claim 1, wherein the second electrode and the fourth electrode are stacked layers of the composite material and a metal material or a light-transmitting conductive material.

7. The light-emitting unit according to claim 1, wherein the metal oxide is molybdenum oxide.

8. The light-emitting unit according to claim 1, wherein the composite material comprises a halogen element.

9. The light-emitting unit according to claim 8, wherein the halogen element is fluorine.

10. A light-emitting device comprising a converter, wherein the light-emitting unit according to claim 1 is driven by an output voltage of the converter.

11. A lighting device comprising the light-emitting unit according to claim 1 in a light-emitting portion.

12. A light-emitting unit comprising:
a first light-emitting element over an insulating surface; a second light-emitting element over the insulating surface; a separation layer; and an insulating layer,
the first light-emitting element comprising:
a first electrode; and
a second electrode overlapping with the first electrode,
the second light-emitting element comprising:
a third electrode,
wherein:
the insulating layer covers an edge portion of the first electrode,
the separation layer is formed over the third electrode,
the separation layer comprises a leg portion and a stage portion over the leg portion,
a projected area of the stage portion to the third electrode is larger than that of the leg portion,
the second electrode is electrically connected to the third electrode in a region overlapping with the stage portion, and
the second electrode comprises a composite material comprising an organic compound and a metal oxide.

13. The light-emitting unit according to claim 12, wherein in a cross section of the separation layer, a space is provided on a leg portion side of a straight line connecting a point where the leg portion is in contact with the third electrode and an edge of the stage portion protruding beyond the leg portion.

14. The light-emitting unit according to claim 12,
wherein the second electrode extends beyond the edge portion of the first electrode with the the insulating layer interposed therebetween.

15. The light-emitting unit according to claim 12, wherein the second electrode is stacked layers of the composite material and a metal material or a light-transmitting conductive material.

16. The light-emitting unit according to claim 12, wherein the metal oxide is molybdenum oxide.

17. The light-emitting unit according to claim 12, wherein the composite material comprises a halogen element.

18. The light-emitting unit according to claim 17, wherein the halogen element is fluorine.

19. A light-emitting device comprising a converter, wherein the light-emitting unit according to claim 12 is driven by an output voltage of the converter.

20. A lighting device comprising the light-emitting unit according to claim 12 in a light-emitting portion.

* * * * *

UNITED STATES PATENT AND TRADEMARK OFFICE
CERTIFICATE OF CORRECTION

PATENT NO. : 8,742,405 B2
APPLICATION NO. : 13/371055
DATED : June 3, 2014
INVENTOR(S) : Hisao Ikeda et al.

It is certified that error appears in the above-identified patent and that said Letters Patent is hereby corrected as shown below:

In the Specification:

Column 1, Line 22; Change "faulted." to --formed.--.

Column 1, Line 45; Change "power, supply" to --power supply--.

Column 5, Line 31; Change "including light-emitting" to --including a light-emitting--.

Column 13, Line 13; Change "known, semiconductor" to --known semiconductor--.

Column 16, Line 63; Change "139, and" to --139 and--.

Column 17, Line 39; Change "be, formed" to --be formed--.

Column 17, Line 54; Change "103$h$" to --103$b$--.

Column 21, Line 66; Change "Miming" to --forming--.

Column 23, Lines 43 to 44; Change "]phenyl-N-phenylamino}" to --]phenyl-N'-phenylamino}--.

Column 26, Line 59; Change "light, emission" to --light emission--.

Column 27, Line 9; Change "beryllium(III)" to --beryllium(II)--.

Signed and Sealed this
Fourteenth Day of October, 2014

Michelle K. Lee
*Deputy Director of the United States Patent and Trademark Office*